(12) United States Patent
Son et al.

(10) Patent No.: US 11,894,092 B2
(45) Date of Patent: Feb. 6, 2024

(54) MEMORY SYSTEM INCLUDING A NONVOLATILE MEMORY DEVICE, AND AN ERASING METHOD THEREOF

(71) Applicant: SAMSUNG ELECTRONICS CO., LTD., Suwon-si (KR)

(72) Inventors: Myoungho Son, Seongnam-si (KR); Wontaeck Jung, Hwaseong-si (KR); Buil Nam, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 260 days.

(21) Appl. No.: 17/325,690

(22) Filed: May 20, 2021

(65) Prior Publication Data

US 2022/0044758 A1 Feb. 10, 2022

(30) Foreign Application Priority Data

Aug. 10, 2020 (KR) ..................... 10-2020-0100101

(51) Int. Cl.
*G11C 29/50* (2006.01)
*H01L 25/18* (2023.01)
(Continued)

(52) U.S. Cl.
CPC .... *G11C 29/50004* (2013.01); *G11C 11/5635* (2013.01); *G11C 11/5671* (2013.01); *G11C 16/0483* (2013.01); *G11C 16/08* (2013.01); *G11C 16/16* (2013.01); *G11C 16/349* (2013.01); *H01L 24/08* (2013.01); *H01L 25/0657* (2013.01); *H01L 25/18* (2013.01); *H10B 41/27* (2023.02); *H10B 43/27* (2023.02);
(Continued)

(58) Field of Classification Search
None
See application file for complete search history.

(56) References Cited

U.S. PATENT DOCUMENTS 5,754,558 A 5/1998 Hayakawa et al.
6,385,090 B1 * 5/2002 Kitazaki ............ G11C 16/3468
365/185.29
(Continued)

FOREIGN PATENT DOCUMENTS

JP 3999900 B2 * 10/2007 ......... G11C 16/0433
KR 10-0935723 12/2009
(Continued)

*Primary Examiner* — Guerrier Merant
(74) *Attorney, Agent, or Firm* — F. Chau & Associates, LLC

(57) ABSTRACT

A fail detecting method of a memory system including a nonvolatile memory device and a memory controller, the fail detecting method including: counting, by the memory controller, the number of erases of a word line connected to a pass transistor; issuing a first erase command, by the memory controller, when the number of erases reaches a reference value; applying a first voltage, by the nonvolatile memory device, in response to the first erase command, that causes a gate-source potential difference of the pass transistor to have a first value; detecting, by the memory controller, a leakage current in a word line, after the applying of the first voltage; and determining, by the memory controller, the word line as a fail when a leakage voltage caused by the leakage current is greater than a first threshold value.

20 Claims, 19 Drawing Sheets

(51) Int. Cl.
*H01L 23/00* (2006.01)
*G11C 11/56* (2006.01)
*G11C 16/04* (2006.01)
*G11C 16/08* (2006.01)
*G11C 16/16* (2006.01)
*G11C 16/34* (2006.01)
*H01L 25/065* (2023.01)
*H10B 41/27* (2023.01)
*H10B 43/27* (2023.01)

(52) U.S. Cl.
CPC .......... *G11C 2029/5004* (2013.01); *H01L 2224/08145* (2013.01); *H01L 2924/1431* (2013.01); *H01L 2924/14511* (2013.01)

(56) References Cited

U.S. PATENT DOCUMENTS

| | | | |
|---|---|---|---|
| 6,862,223 B1 * | 3/2005 | Lee | .................. H10B 41/35 |
| | | | 257/E27.103 |
| 7,463,532 B2 | 12/2008 | Tran et al. | |
| 7,532,513 B2 | 5/2009 | Chen et al. | |
| 8,432,732 B2 | 4/2013 | Li et al. | |
| 9,053,978 B2 | 6/2015 | Nam | |
| 9,711,227 B1 | 7/2017 | Ghai et al. | |
| 9,916,093 B2 | 3/2018 | Shim et al. | |
| 9,934,872 B2 | 4/2018 | Magia et al. | |
| 10,026,482 B2 | 7/2018 | Yamauchi | |
| 10,115,466 B2 | 10/2018 | Park et al. | |
| 10,381,083 B1 * | 8/2019 | Yang | ...................... G11C 16/30 |
| 10,446,257 B2 | 10/2019 | Kim | |
| 10,453,539 B2 | 10/2019 | Seo | |
| 2006/0221708 A1 * | 10/2006 | Higashitani | ........ G11C 16/3409 |
| | | | 365/185.29 |

FOREIGN PATENT DOCUMENTS

| | | | | |
|---|---|---|---|---|
| KR | 10-1161393 | | 6/2012 | |
| KR | 10-2018-0079903 | | 7/2018 | |
| TW | 201138071 A | * | 11/2011 | ......... G11C 16/0441 |
| WO | WO-2006124122 A2 | * | 11/2006 | ......... G11C 11/5628 |

\* cited by examiner

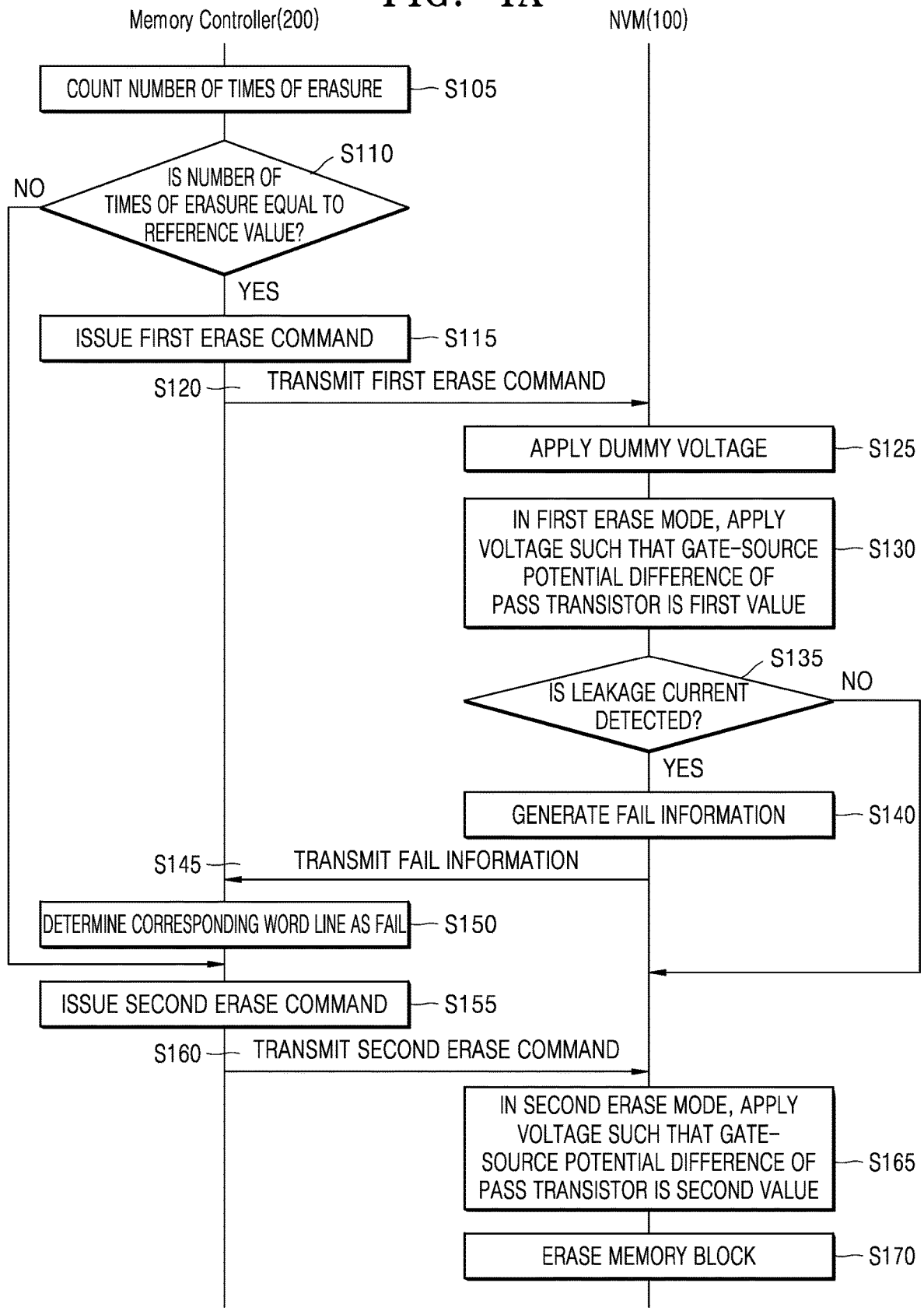

FIG. 12

|  | 1st Erase mode | 2nd Erase mode | DECISION |
|---|---|---|---|
| Case1 | PASS | PASS | PASS |
| Case2 | PASS | FAIL | UECC |
| Case3 | FAIL | – | BAD BLOCK |

MEMORY SYSTEM INCLUDING A NONVOLATILE MEMORY DEVICE, AND AN ERASING METHOD THEREOF

CROSS-REFERENCE TO RELATED APPLICATION

This application claims priority under 35 U.S.C. § 119 to Korean Patent Application No. 10-2020-0100101, filed on Aug. 10, 2020, in the Korean Intellectual Property Office, the disclosure of which is incorporated by reference herein in its entirety.

TECHNICAL FIELD

The inventive concept relates to a memory system, and more particularly, to an erase method of a memory system, the memory system including a nonvolatile memory device in which a not-open string exists and a memory controller.

DISCUSSION OF RELATED ART

As data processed in an electronic device increases in size, more storage is required. To accommodate large sizes in data, a three-dimensional memory device with high integration may be used. In a three-dimensional memory device, there may be a not-open string due to a process error. Since data stored in the non-open string is not highly reliable, a technique for detecting the not-open string may be developed.

SUMMARY

According to an embodiment of the inventive concept, there is provided a fail detecting method of a memory system including a nonvolatile memory device and a memory controller, the fail detecting method including: counting, by the memory controller, the number of erases of a word line connected to a pass transistor; issuing a first erase command, by the memory controller, when the number of erases reaches a reference value; applying a first voltage, by the nonvolatile memory device, in response to the first erase command, that causes a gate-source potential difference of the pass transistor to have a first value; detecting, by the memory controller, a leakage current in a word line, after the applying of the first voltage; and determining, by the memory controller, the word line as a fail when a leakage voltage caused by the leakage current is greater than a first threshold value.

According to an embodiment of the inventive concept, there is provided an erase method of a nonvolatile memory device, the erase method including: receiving an erase command; applying a first voltage, in a first erase mode based on the erase command, that causes a gate-source potential difference of a pass transistor connected to a word line to have a first value; detecting a leakage current on the word line when the pass transistor is off; and in a second erase mode, erasing a memory block connected to the word line as a second voltage is applied that causes the gate-source potential difference to have a second value greater than the first value.

According to an embodiment of the inventive concept, there is provided a memory system including: a nonvolatile memory device; and a memory controller configured to control the nonvolatile memory device, wherein the nonvolatile memory device includes: a memory cell region including a first metal pad; a peripheral region including a second metal pad, the peripheral region being connected to the memory cell region through the first metal pad and the second metal pad; a memory cell array including a plurality of memory cells forming a plurality of strings in a direction substantially perpendicular to a substrate, the memory cell array being included in the memory cell region; a row decoder including a pass transistor configured to switch a plurality of word lines connected to the plurality of memory cells, the row decoder being included in the peripheral region and configured to select, through the plurality of word lines, a memory block that is included in the memory cell array; a voltage generator included in the peripheral region and configured to generate a plurality of voltages provided to the memory cell array and the pass transistor; and a control logic included in the peripheral region and configured to decrease, based on a first erase command, a gate-source potential difference of the pass transistor to detect a leakage current of a word line in the memory block, wherein the memory controller is configured to count the number of erases of the memory block, issue the first erase command when the number of erases reaches a reference value, and detect the leakage current.

According to an embodiment of the inventive concept, there is provided a method for detecting a defective word line in a memory cell array, the method including: determining that a number of erases of a word line connected to a pass transistor is equal to or has exceeded a first value; in response to a first erase command, applying a voltage such that a gate-source potential difference of the pass transistor has a first value; determining whether the pass transistor is off or on; and determining that the word line is defective when the pass transistor is determined to be off.

BRIEF DESCRIPTION OF THE DRAWINGS

The inventive concept will be more clearly understood by describing in detail embodiments thereof with reference to the accompanying drawings in which:

FIG. 4A is a flowchart for describing a fail detecting method of a memory system according to an embodiment of the inventive concept.

FIG. 12 is a table for describing an erasing operation of a nonvolatile memory device according to an embodiment of the inventive concept;

DETAILED DESCRIPTION OF THE EMBODIMENTS

Hereinafter, embodiments of the inventive concept will be described in detail with reference to the accompanying drawings. Herein, embodiments of the inventive concept are described using a NAND flash memory as an example of a nonvolatile memory device. However, it will be understood that the inventive concept is not limited to a NAND flash memory and may be applied to various nonvolatile memory devices such as Electrically Erasable and Programmable Read Only Memory (EEPROM), NOR flash memory, Phase-change Random Access Memory (PRAM), Resistive RAM (RRAM), Ferroelectric RAM (FRAM), Magnetic RAM (MRAM), Spin-Transfer-Torque MRAM, Conductive bridging RAM (CBRAM), Nanotube RAM, Polymer RAM (PoRAM), Nano Floating Gate Memory (NFGM), a holographic memory, a Molecular Electronics Memory, an Insulator Resistance Change Memory, and the like.

Figure 1:
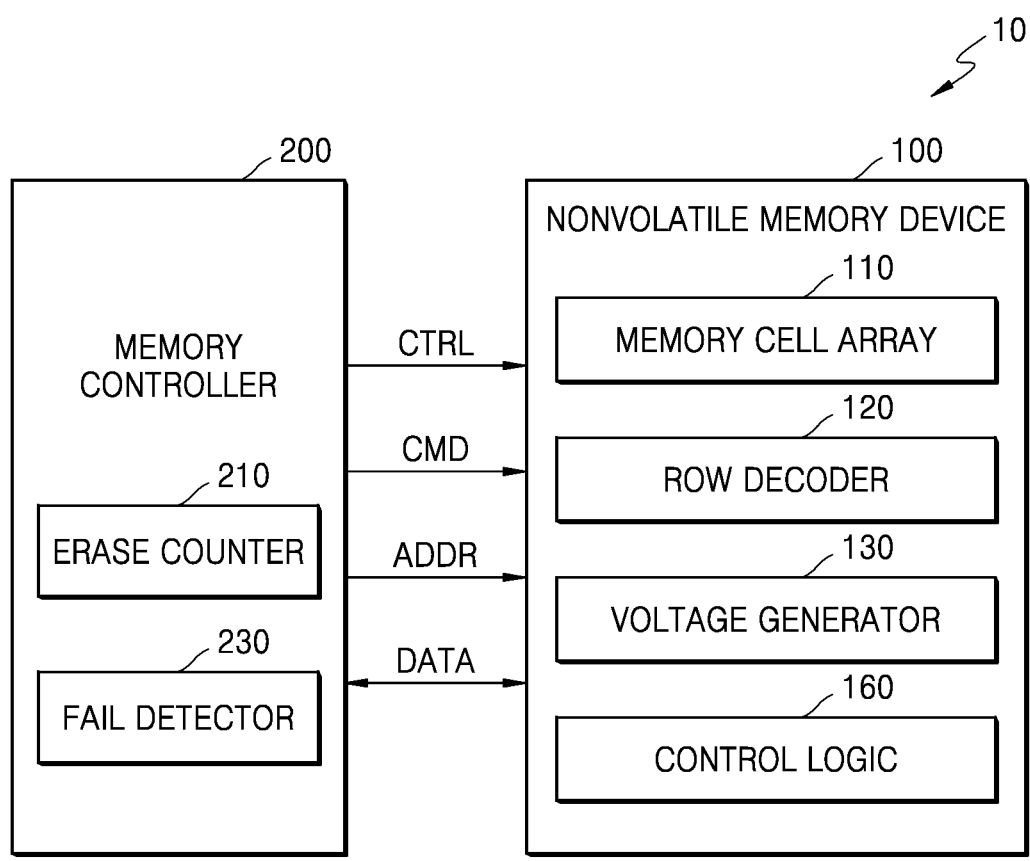
FIG. 1 is a block diagram of a memory system according to an embodiment of the inventive concept.

FIG. 1 is a block diagram of a memory system 10 including a nonvolatile memory device 100 and a memory controller 200 according to an embodiment of the inventive concept.

The memory system 10 may communicate with a host through various interfaces. The host may request data processing operations of the memory system 10, for example, a data read operation, a data write operation, a data erase operation, and the like. In embodiments of the inventive concept, the host may correspond to a central processing unit (CPU), a microprocessor, an application processor (AP), or the like.

The memory system 10 may be implemented as a storage device such as a solid-state drive (hereinafter, referred to as SSD). However, the inventive concept is not limited thereto, and the memory system 10 may be implemented as various kinds of devices such as an embedded multimedia card (eMMC), a universal flash storage (UFS), a compact flash (CF) memory, a secure digital (SD) memory, a micro secure digital (Micro-SD) memory, a mini secure digital (Mini-SD) memory, an extreme digital (xD) memory, a memory stick, or the like. In addition, the memory system 10 may be implemented as a personal computer (PC), a data server, a laptop computer, or a handheld device. The handheld device may be implemented as a mobile phone, a smart phone, a tablet PC, a personal digital assistant (PDA), an enterprise digital assistant (EDA), a digital still camera, a digital video camera, a portable multimedia player (PMP), a personal navigation device or a portable navigation device (PND), a handheld game console, or an e-book. According to embodiments of the inventive concept, the memory system 10 may be implemented as a System-On-a-Chip (SoC).

The memory system 10 may include the nonvolatile memory device 100 and the memory controller 200.

The nonvolatile memory device 100 may include a memory cell array 110, a row decoder 120, a voltage generator 130, and a control logic 160.

The memory cell array 110 may include a plurality of strings (or cell strings) arranged in row and column directions on a substrate. The memory cell array 110 may include a two-dimensional NAND memory array or a three-dimensional (or vertical) NAND (VNAND) memory array.

In embodiments of the inventive concept, each string of the three-dimensional (3D) memory cell array 110 may include a plurality of memory cells stacked in a direction that is perpendicular (or substantially perpendicular) to the substrate. In other words, the memory cells may be stacked in the direction perpendicular to the substrate and form a three-dimensional structure. Arrays of memory cells may include active regions and may be arranged on a silicon substrate or a circuit for performing operations on the memory cells. In this case, the memory cell array 110 of 3D type may be formed in a monolithic manner on the substrate or at least one physical level of a circuit formed in the substrate. The term "monolithic" may indicate that layers in each level included in the array are stacked on layers of each lower level in the array. In an embodiment of the inventive concept, the memory cell array 110 of 3D type may include Vertical NAND strings that are arranged in a vertical direction such that at least one memory cell is above another memory cell.

Each of the memory cells may be implemented as a cell type such as a single-level cell (SLC), a multi-level cell (MLC), or a triple-level cell (TLC). The inventive concept may be flexibly applied according to various cell types of the memory cell.

In an embodiment of the inventive concept, U.S. Pat. Nos. 7,679,133, 8,533,466, 8,654,587, and 8,559,235 and U.S. Patent Application Publication No. 2011/0233648, the disclosures of which are incorporated by reference herein in their entireties, disclose configurations for a 3D memory cell array configured in a plurality of levels, in which word lines and/or bit lines are shared between the plurality of levels. In addition, U. S. Patent Application Publication No. 2012-0051138 and U. S. Patent Application Publication No. 2011-0204400 are incorporated by reference herein in their entireties. It is to be understood, however, that the memory cell array 110 according to an embodiment of the inventive concept is not limited to the above-described 3D type(s).

In embodiments of the inventive concept, the memory cell array 110 may include a Not open string. Not open strings may occur due to errors in processes of the memory cell array 110 that is a three-dimensional type. To increase the integration of the memory, there is a tendency that channels have greater depths and consequently intervals between the channels are narrowed. Due to the physical limitations in semiconductor processes, a top surface of a substrate may have a channel width that is relatively greater than that of a bottom surface of the substrate. In this case, a hole in the channel may burst due to a leakage current generated between adjacent channels among the channels formed perpendicular to the substrate. In an embodiment of the inventive concept, a string in which the leakage current is generated between the adjacent channels may be referred to as a not open string. Occurrence of the leakage current will be described in further detail with reference to FIGS. 13A and 13B.

The row decoder 120 may provide a voltage signal, which is provided from the voltage generator 130, to word lines WLs connected to the memory cell array 110. In an embodiment of the inventive concept, for the memory operation, the row decoder 120 may apply an operation voltage and a verify voltage to a selected word line and apply a pass voltage to a non-selected word line.

The voltage generator 130 may regulate the voltage signal for the memory operations.

The control logic 160 may control general operations of the nonvolatile memory device 100. In embodiments of the inventive concept, the control logic 160 may output various internal control signals to program data to the memory cell array 110, read data from the memory cell array 110, or erase the data stored in the memory cell array 110, based on a command CMD, an address ADDR, and/or a control signal CTRL received from the memory controller 200.

In response to write/read requests from the host, the memory controller 200 may control the nonvolatile memory device 100 to read the data stored in the nonvolatile memory device 100 or to write the data to the nonvolatile memory device 100. For example, the memory controller 200 may control program (e.g., write), read, and erase operations with respect to the nonvolatile memory device 100 by providing the command CMD, the address ADD, and the control signal CTRL to the nonvolatile memory device 100. In addition, the data to be programmed and the read data may be transmitted and received between the memory controller 200 and the nonvolatile memory device 100.

The memory controller 200 may include an erase counter 210 and a fail detector 230.

The erase counter 210 may count a frequency of erase operations performed by the nonvolatile memory device 100. In an embodiment of the inventive concept, the erase counter 210 may determine a time at which the frequency of erase operations reaches preset reference values, and may inform the memory controller 200 to enter the first erase mode. The preset values may be, for example, a multiple of ten, a multiple of one hundred, and the like.

The fail detector 230 may detect a word line in which the leakage current is generated among the plurality of word lines included in the memory cell array 110. In an embodiment of the inventive concept, the fail detector 230 may detect the leakage current, depending on whether the word line is activated, or whether the pass transistor included in the row decoder 120 is turned off. For example, the fail detector 230 may confirm whether the word line is a fail according to whether the pass transistor is activated. In other words, the word line may be determined as a fail as the leakage current reaches a certain threshold value or higher causing the pass transistor to be turned off.

The erase counter 210 and the fail detector 230 may be implemented as processing circuits such as separate hardware within the memory controller 200, or may be implemented as a combination of hardware and software such as a processor configured to execute software performing an erase count function and a fail detection function. Particularly, the processing circuit may be implemented as a central processing unit (CPU), an arithmetic logic unit configured to perform arithmetic and logic operations and a bit shift, a digital signal processor (DSP), a microprocessor, an application specific integrated circuit (ASIC), and the like, but is not limited thereto.

The memory controller 200 may communicate with an external host through various standard interfaces. For example, the memory controller 200 includes a host interface), and the host interface provides various standard interfaces between the host and the memory controller 200. The standard interface may include various interface methods such as Advanced Technology Attachment (ATA), serial ATA (SATA), external SATA (e-SATA), small computer system interface (SCSI), serial attached SCSI (SAS), Peripheral Component Interconnect (PCI), PCI express (PCI-E), IEEE 1394, a universal serial bus (USB), a secure digital (SD) card, a multimedia card (MMC), an embedded multimedia card (eMMC), a universal flash storage (UFS), a compact flash (CF) card interface, and the like.

Figure 2:
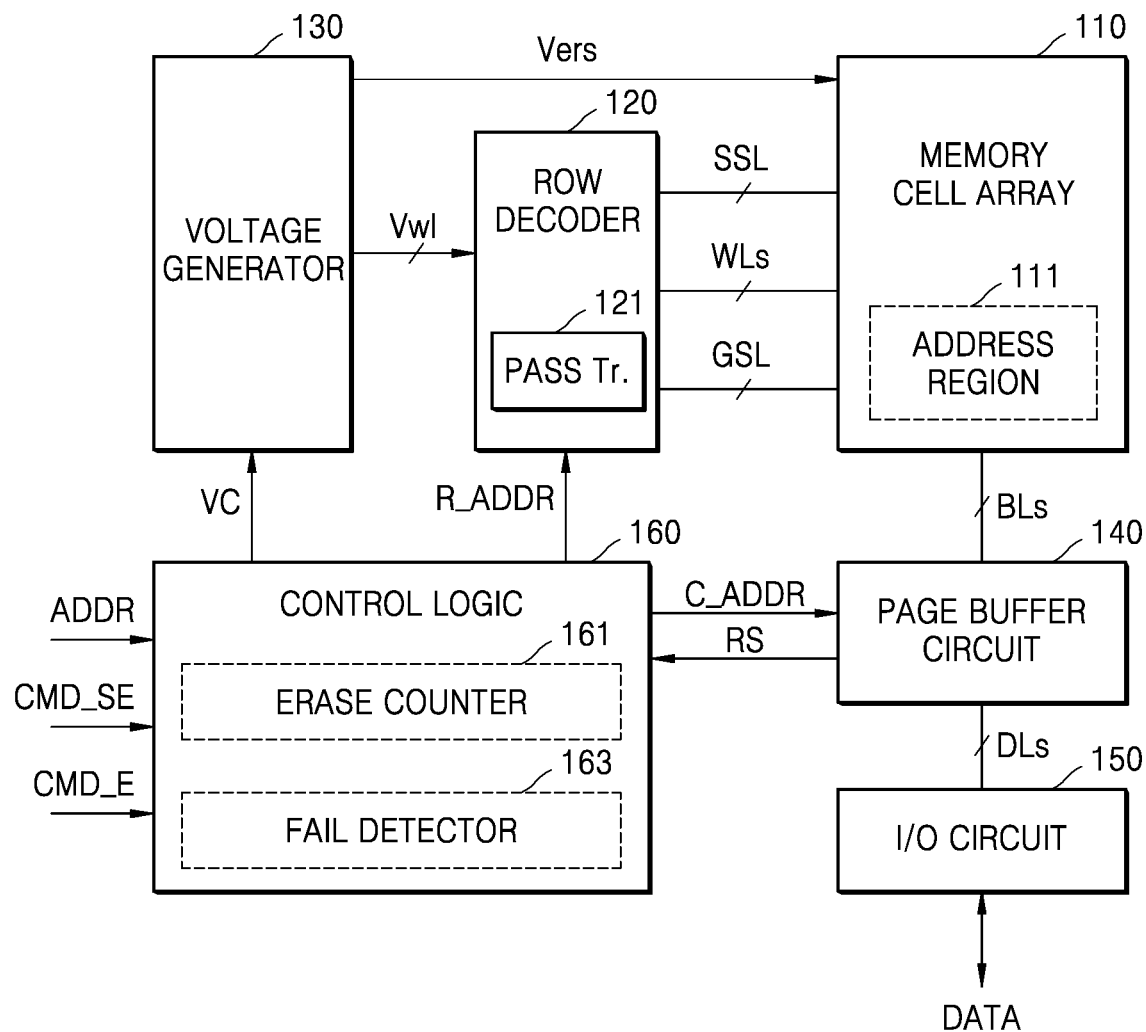
FIG. 2 is a block diagram of a nonvolatile memory device according to an embodiment of the inventive concept.

FIG. 2 is a block diagram of the nonvolatile memory device 100 according to an embodiment of the inventive concept. For the memory cell array 110, the row decoder 120, the voltage generator 130, and the controller 160 shown in FIG. 2, descriptions that are the same as those for the memory cell array 110, the row decoder 120, and the voltage generator 130 in FIG. 1 may be omitted.

Referring to FIG. 2 in conjunction with FIG. 1, the nonvolatile memory device 100 may include the memory cell array 110, the row decoder 120, the voltage generator 130, a page buffer circuit 140, an input/output (I/O) circuit 150, and the control logic 160. The nonvolatile memory device 100 may further include various function blocks related to the memory operations.

The memory cells of the memory cell array 110 may be connected to word lines WLs, a string selection line SSL, a ground selection line GSL, and bit lines BLs. The memory cell array 110 may be connected to the row decoder 120 through the word lines WLs, the string selection line SSL, and the ground selection line GSL, and may be connected to the page buffer circuit 140 through the bit lines BLs.

In embodiments of the inventive concept, the memory cell array 110 may receive a word line voltage Vwl through the word lines WLs, the string selection line SSL, and the ground selection line GSL. In embodiments of the inventive concept, the memory cell array 110 may directly receive an erase voltage Vers that is generated from the voltage generator 130, or may indirectly receive the erase voltage Vers through the word lines WLs.

The memory cell array 110 may include an address region 111 as a storage space. The address region 111 may store location information (for example, an address) of the word lines WLs in which leakage current occurs. For example, the address region 111 may be a buffer. However, this is merely an example, and the memory cell array 110 may not include the address region 111.

When the memory cell array 110 does not include the address region 111, the location information of the word lines WLs may be independently processed by firmware of an electronic device including the nonvolatile memory device 100. For example, the location information (for example, the address) of the word lines in which the leakage current is generated may be provided to the memory controller 200 and processed by the firmware (for example, the erase counter 210 and the fail detector 230) provided in the memory controller 200.

The row decoder 120 may select a certain word line from the plurality of word lines WLs based on a row address R_ADDR from the control logic 160 and provide a signal that activates the selected word line. The row decoder 120 may apply the word line voltage Vwl corresponding to the operation mode through the word line of the selected memory cell or memory block.

According to embodiments of the inventive concept, for the erase operation, the row decoder 120 may apply the erase voltage Vers and the erase verification voltage to the selected word line WL, and apply an erase pass voltage to non-selected word lines. In a read operation, the row decoder 120 may provide a read voltage to a selected word line and provide a read pass voltage to non-selected word lines.

The row decoder 120 may include a pass transistor 121. The pass transistor 121 may be connected to the word line and determine whether to provide the signals to the memory cell through the word line. For example, if the memory cell array 110 includes m word lines, the row decoder 120 may include m pass transistors 121. The structure of the pass transistor 121 will be described in further detail with reference to FIG. 3.

The voltage generator 130 may include one or more pumps, and may generate voltages having various levels according to a pumping operation based on a voltage control signal VC.

In embodiments of the inventive concept, the voltage generator 130 may generate the word line voltage Vwl based on a voltage control signal VC provided from the control logic 160. The word line voltage Vwl may include various kinds of voltages to manage data in the memory cells.

In embodiments of the inventive concept, the voltage generator 130 may receive the voltage control signal VC from the control logic 160, and may generate the word line voltage Vwl and the erase voltage Vers according to the type of the voltage control signal VC. For example, the voltage generator 130 may generate a program voltage for storing data in the memory cell, the read voltage for reading the data written in the memory cell, and the erase voltage for erasing the data written in the memory cell. In addition, the voltage generator 130 may generate a voltage for activating the pass transistor 121 (for example, an erase word line voltage and a block word line voltage). The word line voltage Vwl may be provided to the row decoder 120, and the erase line voltage Vers may be provided to the memory cell array 110.

The page buffer circuit 140 may temporarily store pieces of data to be programmed to the memory cell array 110 and pieces of data read from the memory cell array 110. The page buffer circuit 140 may include a plurality of latch portions (e.g., page buffers). In embodiments of the inventive concept, each of the latch portions may include a plurality of latches corresponding to a plurality of bit lines BLs and store data in page units. In some embodiments of the inventive concept, the page buffer circuit 140 may include a sensing latch portion, and the sensing latch portion may include a plurality of sensing latches corresponding to the plurality of bit lines BLs. In addition, each of the sensing latches may be connected to a corresponding sensing node in which data is detected, through a corresponding bit line.

The page buffer circuit 140 may be connected to the I/O circuit 150 through a plurality of data lines DLs.

The page buffer circuit 140 may select some of the bit lines BLs in response to a column address signal C-ADDR. In embodiments of the inventive concept, the page buffer circuit 140 may operate as a write driver or a sensing amplifier according to operation modes. For example, in a read operation, the page buffer circuit 140 may operate as a sensing amplifier and output data stored in the memory cell array, and in a programming operation, the page buffer circuit 140 may operate as a write driver and input data to be stored in the memory cell array 110.

According to embodiments of the inventive concept, as the word line voltage Vwl for the erase operation is applied to the plurality of memory cells of the memory cell array 110, the page buffer circuit 140 may provide result signals RS, which are output from the bit lines BLs, to the control logic 160. The control logic 160 may detect not-open strings among the plurality of strings based on the result signals RS received from the page buffer circuit 140.

The I/O circuit 150 may receive data from the outside or transmit data to the outside. In embodiments of the inventive concept, the I/O circuit 150 may convert binarized data signals received from the page buffer circuit 140 through the data lines DLs, and may perform the read operation by transmitting the converted signals to the outside as the data. In embodiments of the inventive concept, the I/O circuit 150 may perform a program operation by receiving the data DATA from the outside and transmitting the data DATA to the page buffer circuit 140 through the data lines DLs.

The various internal control signals output from the control logic 160 may be provided to the row decoder 120, the voltage generator 130, and the page buffer circuit 140. For example, the control logic 160 may provide a row address signal R_ADDR to the row decoder 120, provide the voltage control signal VC to the voltage generator 130, and provide the column address signal C_ADDR to the page buffer circuit 140.

According to embodiments of the inventive concept, the control logic 160 may include an erase counter 161 and a fail detector 163. The control logic 160 may drive the erase counter 161 and the fail detector 163 in response to a second erase command CMD_E and/or the address ADDR.

The erase counter 161 may count an erase frequency of the memory block included in the memory cell array 110. The erase frequency of the memory block may be equal to an erase frequency of the word line connected to each memory cell, and therefore, a same technical effect may be obtained by counting the erase frequency of each word line from the plurality of word lines WLs.

According to embodiments of the inventive concept, the control logic 160 may determine whether to enter the first erase mode based on the erase frequency of the memory block that is counted by the erase counter 161 based on the second erase command CMD_E (in other words, the erase frequency of the word line). The control logic 160 may enter the first erase mode every time the erase frequency reaches reference values. For example, the control logic 160 may enter the first enter mode every time the erase frequency reaches a multiple of ten. As another example, to manage power of the nonvolatile memory device 100, the control logic 160 may enter the first erase mode every time the erase frequency reaches a multiple of ten or a multiple of one hundred. However, the inventive concept is not limited to the above-stated values.

In an embodiment of the inventive concept, as a result of entering the first erase mode, the control logic 160 may apply a voltage such that a gate-source potential difference of the pass transistor 121 is a first level. In embodiments of the inventive concept, the gate-source potential difference in the first erase mode may be shifted down compared to that in a normal erase mode. As a result, a leakage current occurring between channels may be more sensitively sensed.

In an embodiment of the inventive concept, the fail detector 163 may detect the leakage current in the word line by sensing the leakage current. According to an embodiment of the inventive concept, the fail detector 163 may receive the result signal RS, and may detect the leakage current in the word line, based on the threshold voltage, the gate-source potential difference, and a drain-source potential difference of the pass transistor 121. In addition, the fail detector 163 may detect a leakage voltage that is a voltage change value due to the leakage current.

According to an embodiment of the inventive concept, the control logic 160 may detect, based on the result signal RS, a word line in which the leakage current occurred from the plurality of word lines WLs. In an embodiment of the inventive concept, when a leakage voltage due to the leakage current is greater than a first threshold value, the fail detector 163 may recognize that the pass transistor 121 is turned off. As a result, the fail detector 163 may detect the word line in which the leakage current occurs.

In an embodiment of the inventive concept, after recognizing the leakage current, the control logic 160 may enter the second erase mode without receiving other commands. When in the second erase mode, the control logic 160 may apply a voltage such that the gate-source potential difference of the pass transistor 121 is a second value. In an embodiment of the inventive concept, the gate-source potential difference in the second erase mode may increase again. The gate-source potential difference will be described in further detail with reference to FIG. 3, and the first erase mode and the second erase mode will be described in further detail with reference to FIG. 7.

In an embodiment of the inventive concept, the erase counter 161 and the fail detector 163 may be implemented as processing circuits such as hardware included within or connected to the control logic 160, or may be implemented as a combination of hardware and software such as a processor configured to execute software that performs the erase count function and the fail detection function. Particularly, the processing circuit may be implemented as a central processing unit (CPU), an arithmetic logic unit configured to perform arithmetic and logic operations and a bit shift, a digital signal processor (DSP), a microprocessor, an application specific integrated circuit (ASIC), and the like, but is not limited thereto.

In an embodiment of the inventive concept, the erase counter 161 counting the erase frequency of the memory block and the fail detector 163 detecting fails of the memory block may be not operated in the control logic 160 and may be separately operated at the outside of the nonvolatile memory device 100. According to an embodiment of the inventive concept, by the firmware of the memory controller 200, the erase counter 210 counting the erase frequency of the memory block and the fail detector 230 detecting the fails of the memory block may be operated. The erase counter 210 and the fail detector 230 may be functional portions implemented as hardware included in the memory controller 200 or implemented with software in a processor. Operations of counting erase and detecting fails in the nonvolatile memory device 100 will be described in further detail with reference to FIG. 4B.

According to an embodiment of the inventive concept, a case in which the erase counter 210 counting the erase frequency of the memory block and the fail detector 230 detecting the fails of the memory block by the firmware of the memory controller 200 will be described hereinafter.

According to an embodiment of the inventive concept, the control logic 160 may enter the first erase mode based on the first erase command CMD_SE. In the first erase mode, the control logic 160 may apply a voltage such that the gate-source potential difference of the pass transistor 121 is the first level. In embodiments of the inventive concept, the gate-source potential difference in the first erase mode may drop compared to that in a normal erase mode. As a result, a leakage current occurring between channels may be more sensitively sensed.

According to an embodiment of the inventive concept, the control logic 160 may enter the second erase mode based on the second erase command CMD_E. In the second erase mode, the control logic 160 may apply a voltage such that the gate-source potential difference of the pass transistor is a second value. In an embodiment of the inventive concept, the gate-source potential difference in the second erase mode may increase again.

The erase counter 210 and the fail detector 230 may determine whether the pass transistor 121 is turned off based on word line voltage signals included in the data, and may confirm an occurrence of the leakage current as a result of the determination. In an embodiment of the inventive concept, the fail detector 230 may determine without delay the word line, in which the leakage current is generated, and a memory block connected to the word line as fails. In this case, the memory controller 200 may mark the address to prevent the writing of data to the memory block determined as a fail, and may adjust a mapping of a logical address and a physical address such that the data is written in a different address other than the address of the memory block determined as a fail. A case in which the erase counter 210 counting the erase frequency of the memory block and the fail detector 230 detecting the fails of the memory block by the firmware of the memory controller 200 will be described in further detail with reference to FIG. 4A.

The nonvolatile memory device 100 according to an embodiment of the inventive concept, when performing the erase operation, may detect a leakage current, which has occurred due to the not-open string, and may determine the memory block, in which the leakage current is generated, as a fail. In addition, the nonvolatile memory device 100 according to an embodiment of the inventive concept may recognize the word line in which the leakage current is generated before data is programmed, and thus, may prevent uncorrectable errors of a memory block that occur when programming the not-open string.

Figure 3:
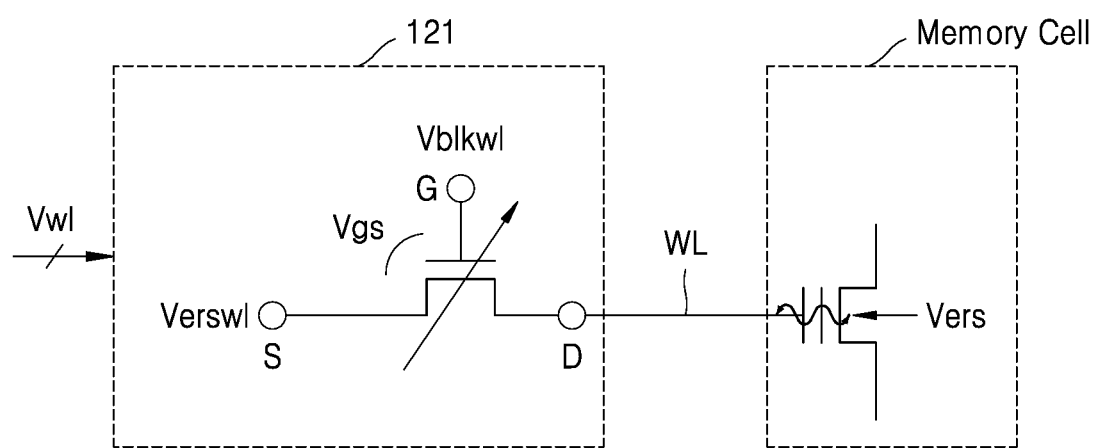
FIG. 3 is a circuit diagram of a pass transistor and a memory cell according to an embodiment of the inventive concept.

FIG. 3 is a circuit diagram of the pass transistor 121 and a memory cell according to an embodiment of the inventive concept.

Referring to FIG. 3, the pass transistor 121 may be connected to one memory cell included in the memory cell array 110 through the word line WL. The pass transistor 121 may receive the word line voltage Vwl generated in the voltage generator 130, and the memory cell may receive the erase voltage Vers generated in the voltage generator 130. In an embodiment of the inventive concept, the word line voltage Vwl provided to the pass transistor 121 may include an erase word line voltage Verswl and a block word line voltage Vblkwl. For example, the erase word line voltage Verswl may be input directly to a source terminal S of the pass transistor 121 and the block word line voltage Vblkwl may be input directly to a gate terminal G of the pass transistor 121. The erase voltage Vers may be directly provided from the voltage generated at the voltage generator 130, but is not limited thereto, and may be first transmitted to the row decoder 120 and then provided through the word line WL.

Due to physical limitations in the three-dimensional memory cell array process, a leakage current may be generated between the strings. Due to the leakage current, a charge of the memory cell may move onto the word line WL, and a potential variation may occur on the word line WL. For example, due to the leakage current, a voltage of the word line WL may increase.

The voltage generator 130 may generate a voltage (for example, the erase word line voltage Verswl and the block word line voltage Vblkwl) activating the pass transistor 121.

In an embodiment of the inventive concept, the erase word line voltage Verswl may be applied to the source terminal S of the pass transistor 121, and the block word line voltage Vblkwl may be applied to the gate terminal G of the pass transistor 121. A drain terminal D of the pass transistor 121 may be in contact with the word line WL. In other words, the drain terminal D may connect the pass transistor 121 to the word line WL. In an embodiment of the inventive concept, for convenience of explanation, the source terminal S and the drain terminal D are illustrated as being on the left side of FIG. 3 and the right side of FIG. 3, respectively. However, the inventive concept is not limited thereto, and positions of the source terminal S and the drain terminal D may be changed with each other according to a flow of the leakage current and various methods of forming the channels.

When the block word line voltage Vblkwl provided to the gate terminal G exceeds a threshold voltage of the pass transistor 121, the pass transistor 121 may be in an active state, and a channel may be formed. For example, when the block word line voltage Vblkwl is three volts (V) and the threshold voltage Vth of the pass transistor 121 is 1.4 V, the pass transistor 121 may be in the active state.

According to an embodiment of the inventive concept, when the erase word line voltage Verswl applied to the source terminal S of the pass transistor 121 is less than a difference between the block word line Vblkwl and the threshold voltage, the channel formed in the pass transistor 121 may be maintained. However, when the leakage current exists, a potential of the word line WL is raised, and accordingly, the erase word line voltage Verswl applied to the source terminal S of the pass transistor 121 approaches the difference between the block word line voltage Vblkwl and the threshold voltage. In this case, the pass transistor 121 may be in a deep-triode state or a floating state. For example, when the difference between the block word line voltage Vblkwl and the threshold voltage is 1.6 V and the erase word line voltage Verswl is 0.7 V, the increased potential of the word line WL approaches 0.9 V due to the leakage current, and therefore, the pass transistor 121 may be turned off by being in the floating state.

According to an embodiment of the inventive concept, the nonvolatile memory device 100 (see FIG. 1) may perform different erase operations according to the two erase modes, and the pass transistor 121 may be differently switched according to the two erase modes.

The first erase mode will now be described. According to an embodiment of the inventive concept, the gate-source potential difference Vgs, which is the potential difference between the source terminal S to which the erase word line voltage Verswl is applied and the gate terminal G to which the block word line voltage Vblkwl is applied, may drop from a first value to a second value that is less than the first value. In an embodiment of the inventive concept, as the erase word line voltage Verswl increases while the block word line voltage Vblkwl is constant, the gate-source potential difference Vgs may drop. In an embodiment of the inventive concept, as the block word line voltage Vblkwl drops while the erase word line voltage Verswl is constant, the gate-source potential difference Vgs may drop. In addition, according to an embodiment of the inventive concept, as the erase word line voltage Verswl increases and the block word line voltage Vblkwl drops, the gate-source potential difference Vgs may drop.

$$V_{ERSWL} + V_{LEAK} \geq V_{BLKWL} - V_{TH} \quad \text{[Equation 1]}$$

Referring to Equation 1, in an embodiment of the inventive concept, when a sum of the erase word line voltage Verswl (or $V_{ERSWL}$) and the leakage voltage, Vleak (or $V_{LEAK}$) that is a voltage change value due to the leakage current is equal to or greater than a difference between the block word line voltage Vblkwl (or $V_{BLKWL}$) and the threshold voltage Vth ($V_{TH}$), or the pass transistor 121 may be turned off. When the pass transistor 121 is turned off, signal transmission to the word line WL connected to the pass transistor 121 that is turned off may be prevented, thereby implementing the switching of the word line WL connected to the pass transistor 121 that is turned off, and as a result, the memory block connected to the word line WL may be determined as a fail. The address of the memory block determined as a fail may be stored, as described above, in the address region 111 (see FIG. 2) of the memory cell array 110 or may be processed by the firmware.

Referring to Equation 1, according to an embodiment of the inventive concept, when the erase word line voltage Verswl increases while the block word line voltage Vblkwl is constant (in other words, the gate-source potential difference Vgs drops), the left portion of Equation 1 relatively increases, and therefore, the pass transistor 121 may be easily turned off even due to a relatively small change in the leakage voltage Vleak.

Referring again to Equation 1, according to an embodiment of the inventive concept, when the block word line voltage Vblkwl drops while the erase word line voltage Verswl is constant, the right portion of Equation 1 relatively decreases, and therefore, the pass transistor 121 may be easily turned off even due to a relatively small change in the leakage voltage Vleak.

According to an embodiment of the inventive concept, in the first erase mode, the erase word line voltage Vblkwl may rise up to 1.4 V, and a voltage reference level of a first verify voltage Vvrf1 used to detect the fails of the word line may be set as 1.6 V. Even the generation of only 0.2 V of leakage voltage Vleak exceeds the first verify voltage Vvrf1 level, and therefore, fails of the word line may be easily detected by the fail detector 163 (see FIG. 1).

Equation 1 may be summarized again as follows.

$$V_{LEAK} \geq V_{GS} - V_{TH} \quad \text{[Equation 2]}$$

Referring to Equation 2, the erase word line voltage Verswl is the voltage of the source terminal S of the pass transistor 121, and the block word line voltage Vblkwl is the voltage of the gate terminal G of the pass transistor 121, and therefore, the erase word line voltage Verswl of Equation 1 may be shifted to the right. As a result, the difference between the block word line voltage Vblkwl and the erase word line voltage Verswl may be abbreviated as the gate-source potential difference Vgs. In an embodiment of the inventive concept, a difference between the gate-source potential difference Vgs and the threshold voltage Vth may be referred to as an overdrive voltage.

According to an embodiment of the inventive concept, when the leakage voltage Vleak is greater than the gate-source potential difference Vgs (in other words, the overdrive voltage), the pass transistor 121 may be turned off (or be in the deep-triode state). As a result, due to the decrease in the gate-source potential difference Vgs, sensing sensibility of the leakage current that occurred in the word line WL may be increased.

Described hereinafter is the second erase mode. According to an embodiment of the inventive concept, the gate-source potential difference Vgs may increase from the second value to the first value that is greater than the second value. In this case, the erase operation of the memory cell may be performed according to the erase voltage Vers. For example, compared to being 1.4 V in the first erase mode, the erase word line voltage Verswl may drop down to 0.7 V in the second erase mode. In other words, the erase word line voltage Verswl of the second mode may be half that of the first mode. Different from the first verify voltage Vvrf1 for detecting fails of the word line, a voltage reference level of a second verify voltage Vvrf2 for verifying the erase operation may be set as 0.8 V. Accordingly, in the second erase mode, the erase word line voltage Verswl that relatively lowered may perform a normal erase operation.

According to an embodiment of the inventive concept, the nonvolatile memory device 100 performs the erase operation twice. However, in the first erase mode, a fail word line (or a fail memory block) in which the leakage current flows in an amount equal to or greater than the first threshold value is detected. In this case, the normal erase operation is performed after determining only the above fail word line as a fail, and therefore, the process may be faster compared to determining fails of all of the word lines. In other words, in an embodiment of the inventive concept, a normal erase operation is performed after determining just one fail word line.

Figure 4B:
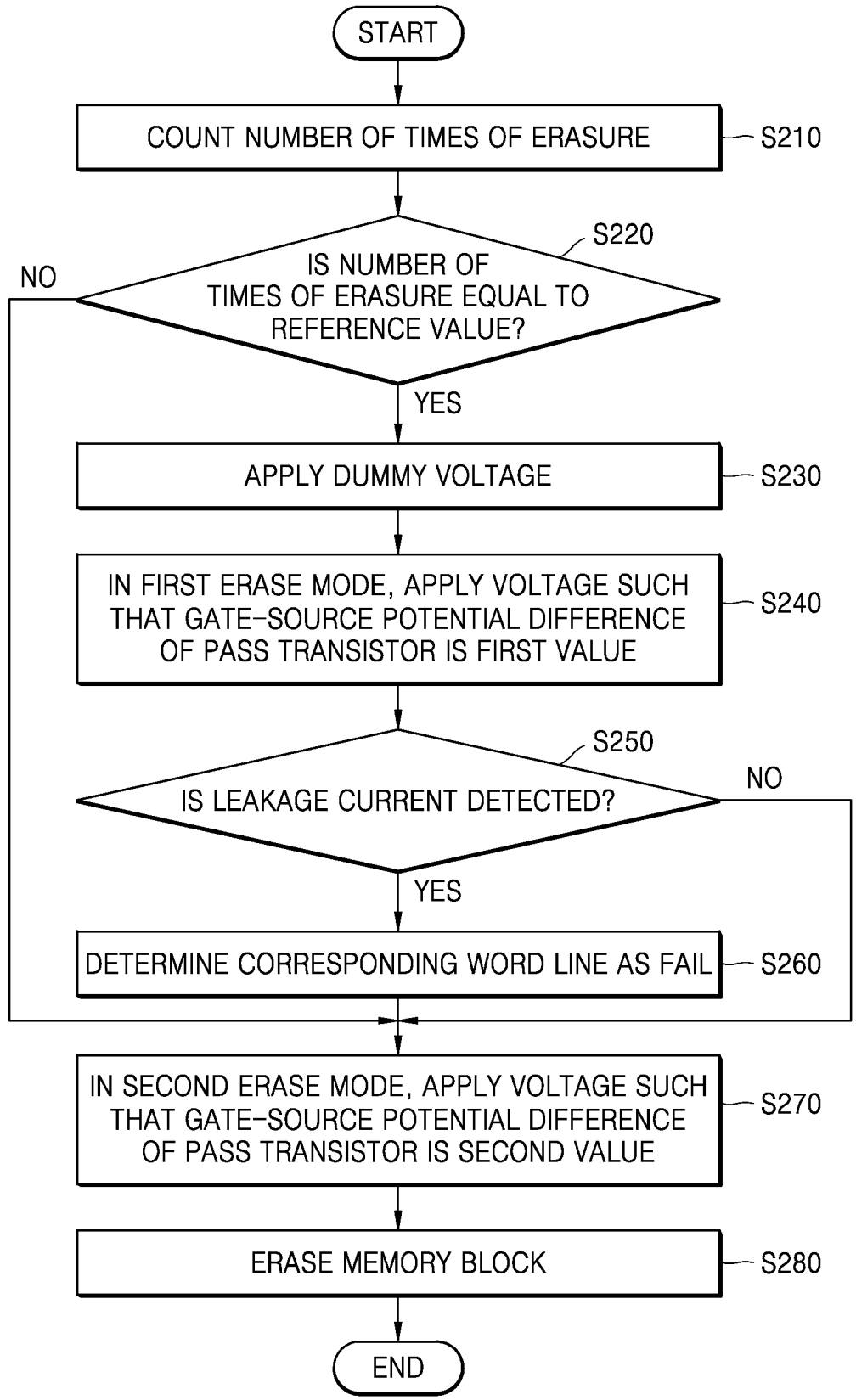
FIG. 4B is a flowchart for describing a fail detecting method of a nonvolatile memory device according to an embodiment of the inventive concept.

FIG. 4 is a flowchart for describing a fail detecting method of a memory system according to an embodiment of the inventive concept, and FIG. 4B is a flowchart for describing a fail detecting method of a nonvolatile memory device according to an embodiment of the inventive concept. Refer to FIGS. 4A and 4B in conjunction with FIGS. 1 and 2.

FIG. 4A shows a case in which the erase counter 210 for counting the erase frequency of the memory block and the fail detector 230 for detecting fails of the memory block are operated by the firmware of the memory controller 200.

Referring to FIG. 4A, in operation S105, the erase counter 210 included in the memory controller 200 may count the frequency of the erase operation that is performed in the nonvolatile memory device 100. For example, the erase counter 210 may count the number of erase operations performed in the nonvolatile memory device 100.

In operation S110, the erase counter 210 may determine a time at which the frequency of erase operations reaches a preset reference value (for example, a multiple of ten or a multiple of one hundred). If the frequency of erase operations does not reach the preset reference value, the method waits for the second erase command to be issued in operation S155. When the frequency of erase operations reaches the preset reference value, the method proceeds to operation S115.

In operation S115, the memory controller 200 may issue a first erase command CMD_SE. The first erase command CMD_SE is a signal that commands the nonvolatile memory device 100 to enter a first erase mode.

In operation S120, as the first erase command CMD_SE is issued, the first erase command CMD_SE is transmitted from the memory controller 200 to the nonvolatile memory device 100.

In operation S125, the nonvolatile memory device 100 may enter the first erase mode by receiving the first erase command CMD_SE. In the first erase mode, the nonvolatile memory device 100 may confirm the state of the memory cell by applying a dummy voltage. For example, the dummy voltage may be applied to the memory cell. In an embodiment of the inventive concept, the control logic 160 may provide the voltage control signal VC for generating a dummy voltage to the voltage generator 130, and the row decoder 120 may provide the dummy voltage to the memory cell array 110 through the plurality of word lines WLs.

In operation S130, in the first erase mode, the nonvolatile memory device 100 may apply a voltage such that the gate-source potential difference Vgs of the pass transistor 121 has the first value. In an embodiment of the inventive concept, the control logic 160 may provide the voltage control signal VC to the voltage generator 130, and the word line voltage Vwl to the row decoder 120. Here, the voltage control signal VC is used to decrease a voltage of the gate terminal G or increase a voltage of the source terminal S of the pass transistor 121. As a result, a potential of the gate terminal G of the pass transistor 121 may decrease, or a potential of the source terminal S of the pass transistor 121 may increase.

In operation S135, the leakage current that occurred in the word line may be detected. In an embodiment of the inventive concept, when the potential of the gate terminal G of the pass transistor 121 decreases or the potential of the source terminal S of the pass transistor 121 increases, the sensing sensitivity of the leakage current may increase, and therefore, even if the amount leakage current is relatively small, the pass transistor 121 may be turned off or be in the deep-triode region. Since the pass transistor 121 is turned off, it is confirmed that the leakage current equal to or greater than a first threshold value has occurred. When the leakage current is not detected, the method proceeds to operation S165; and when the leakage current is detected, the method proceeds to operation S140.

In operation S140, fail information is generated. The fail information may include location information of a word line where the leakage current is present and the memory block connected to the word line.

In operation S145, the fail information may be included in the data and provided to the memory controller 200 from the nonvolatile memory device 100.

In operation S150, the memory controller 200 may confirm the leakage current based on the data and determine the word line identified in the data as a fail. According to an embodiment of the inventive concept, the fail detector 230 may detect the generation of the leakage current, based on whether the word line is activated, or whether the pass transistor 121 included in the row decoder 120 is turned off. For example, the fail detector 230 may confirm if the word line is a fail, based on whether the pass transistor 121 that is turned off as the leakage current reaches a certain threshold value or higher. In addition, the fail detector 230 may determine a memory block connected to the word line as a fail, when the word line is a fail.

In operation S155, after confirming whether the leakage current occurred in the word line, the memory controller 200 may issue the second erase command CMD_E.

In operation S160, as the second erase command CMD_E is issued, the second erase command CMD_E may be transmitted to the nonvolatile memory device 100.

In operation S165, the nonvolatile memory device 100 may enter the second erase mode by receiving the second erase command CMD_E, and may apply a voltage such that the gate-source potential voltage Vgs of the pass transistor 121 has the second value. In an embodiment of the inventive concept, the control logic 160 may provide the voltage control signal VC to the voltage generator 130, wherein the voltage control signal VC increases the voltage of the gate terminal G of the pass transistor 121 or decreases the voltage of the source terminal S of the pass transistor 121, and the voltage generator 130 may provide the word line voltage Vwl to the row decoder 120. As a result, the gate-source potential difference Vgs of the pass transistor 121 may have the second value that is greater than the first value in the first erase mode.

In operation S170, the nonvolatile memory device 100 may complete the erase operation of the memory block.

FIG. 4B is a diagram of a case in which the erase count and fail detection are performed in the nonvolatile memory device 100 itself. Referring to FIG. 4B, in operation S210, data may be repeatedly written to/deleted from the memory cell of the nonvolatile memory device 100. The erase counter 161 of the control logic 160 may count the erase frequency of the word line WL connected to the memory cell to determine the erase frequency of the memory cell. In other words, the erase counter 161 may count the number of times the memory cell has been erased.

In operation S220, the erase counter 161 may determine whether the erase frequency reached the reference value. In embodiments of the inventive concept, the reference value may be preset as one of values such as a multiple of ten or a multiple of one hundred. The reference values are not limited to the described values and may be variously changed for efficiency in the leakage current detection and/or power control.

When the leakage current does not reach the reference value, the erase operation may be shifted to the second erase mode (to operation S270). In other words, the erase operation may skip to the second erase mode.

In operation S230, when the erase frequency reaches the reference value, the control logic 160 may apply the dummy voltage to the memory cell. In an embodiment of the inventive concept, the dummy voltage applied to the memory cell may be used for sensing the leakage current, which is generated in the word line WL, by temporarily programming data to the memory cell.

In operation S240, the nonvolatile memory device 100 in the first erase mode may decrease the gate-source potential voltage Vgs of the pass transistor 121. According to an embodiment of the inventive concept, the control logic 160 may provide the voltage control signal VC for decreasing the gate-source potential difference Vgs to the voltage generator 130, and the voltage generator 130 may provide the word line voltage Vwl, which is generated for decreasing the gate-source potential difference Vgs, to the row decoder 120 and/or the memory cell array 110. As a consequence of operation S240, the gate-source potential difference Vgs may have a first value.

In operation S250, the fail detector 163 may detect the leakage current. The leakage current generated due to the proximity of adjacent strings may increase the voltage of the word line WL, and since the gate-source potential difference Vgs is decreased to more precisely sense this leakage current, the leakage current may be more easily detected.

When the leakage current is not detected, the erase operation may be shifted to the second erase mode (to operation S270).

In operation S260, when the leakage voltage Vleak due to the leakage current exceeds the threshold value, the pass transistor 121 may be turned off. In an embodiment of the inventive concept, since the pass transistor 121 is turned off and the word line voltage Vwl is not applied to the memory cell, the fail detector 163 may determine the word line WL as a fail. The information (for example, the address and the like) of the memory cell connected to the word line WL is referred by firmware by being directly stored in the address region 111 included in the memory cell array 110 or being stored outside of the nonvolatile memory device 100. As a result, this information is processed such that the nonvolatile memory device 100 does not write data to the memory cell that is determined as the fail.

In operation S270, the nonvolatile memory device 100 may enter the second erase mode. According to shift to the second erase mode, the control logic 160 may increase the gate-source potential difference Vgs of the pass transistor 121 to a second value.

In operation S280, the nonvolatile memory device 100 may perform the normal erase operation on the memory cell. In embodiments of the inventive concept, verification on the erase operation may be performed based on the voltage reference level of the second verify voltage Vvrf2.

Figure 5:
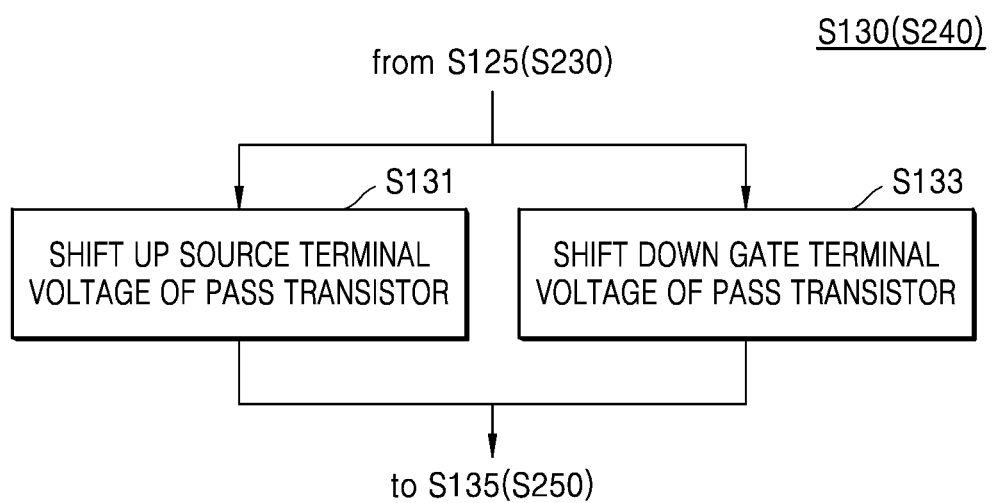
FIG. 5 is a flowchart for describing a fail detecting method of a nonvolatile memory device according to an embodiment of the inventive concept.

FIG. 5 is a flowchart for describing a fail detecting method of a nonvolatile memory device according to an embodiment of the inventive concept. FIG. 5 is a flowchart for describing operation S130 of FIG. 4A or operation S240 of FIG. 4B in further details. Refer to FIGS. 1 and 3 in conjunction with FIG. 4.

After operation S125 (or operation S230) is performed, in the first erase mode, the control logic 160 of the nonvolatile memory device 100 may drop the gate-source potential difference Vgs of the pass transistor 121. Two methods are described as examples to decrease the gate-source potential difference Vgs.

According to operation S131, as a method of decreasing the gate-source potential difference Vgs, the voltage of the source terminal S of the pass transistor 121 may be increased. In other words, the voltage of the source terminal S may be shifted up. Referring again to Equation 1, as the voltage of the erase word line voltage Verswl applied to the voltage of the source terminal S is increased, the occurrence of a relatively small leakage current may be easily sensed.

According to operation S133, as another method of decreasing the gate-source potential difference Vgs, the voltage of the gate terminal G of the pass transistor 121 may be decreased. In other words, the voltage of the gate terminal G of the pass transistor 121 may be shifted down. Referring again to Equation 1, as the voltage of the block word line voltage Vblkwl applied to the voltage of the gate terminal G is decreased, a leakage current that is relatively small may be easily detected.

After performing operation S131 or operation S133, operation S135 (or operation S250) may be performed.

Figure 6:
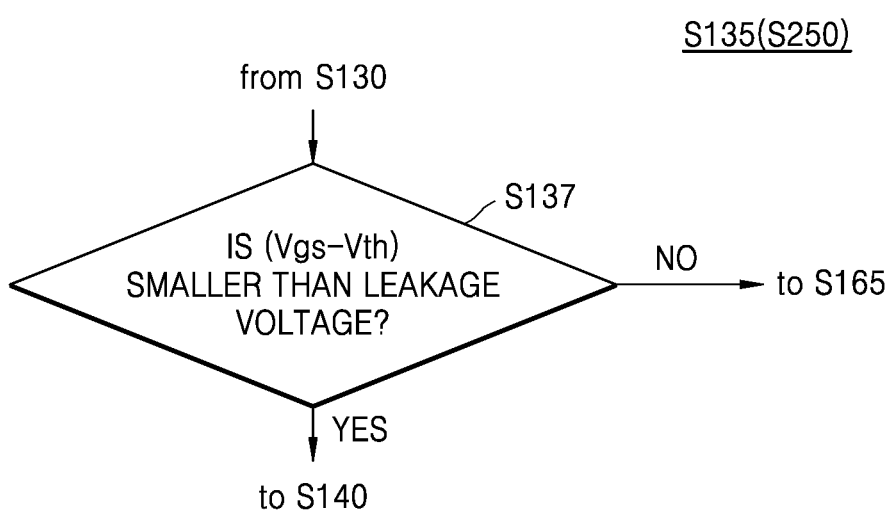
FIG. 6 is a flowchart for describing a fail detecting method of a nonvolatile memory device according to an embodiment of the inventive concept.

FIG. 6 is a flowchart for describing a fail detecting method of the nonvolatile memory device according to an embodiment of the inventive concept. FIG. 6 is a flowchart for describing operation S135 of FIG. 4A or operation S250 of FIG. 4B in further detail. Refer to FIG. 2 in conjunction with FIG. 6.

In operation S137 which follows operation S130 (or operation S240), the fail detector 163 included in the control logic or the fail detector 230 included in the memory controller 200 may each compare a difference between the gate-source potential difference Vgs and the threshold voltage Vth to the leakage voltage generated due to the leakage current.

In an embodiment of the inventive concept, the erase word line voltage Verswl is the voltage of the source terminal S of the pass transistor 121, and the block word line voltage Vblkwl is the voltage of the gate terminal G of the pass transistor 121, and therefore, as described above, may be abbreviated as the gate-source potential difference Vgs. In an embodiment of the inventive concept, the difference between the gate-source potential difference Vgs and the threshold voltage Vth is the overdrive voltage. In this case, the fail detector 163 may compare the overdrive voltage to the leakage voltage Vleak, and when the leakage voltage Vleak is greater than or equal to the overdrive voltage, the fail detector 163 may detect the leakage current. Thereafter, when the leakage voltage Vleak is greater than the overdrive voltage, the method proceeds to operation S140 (or operation S260), otherwise, the method proceeds to operation S165 (operation S270).

Figure 7:
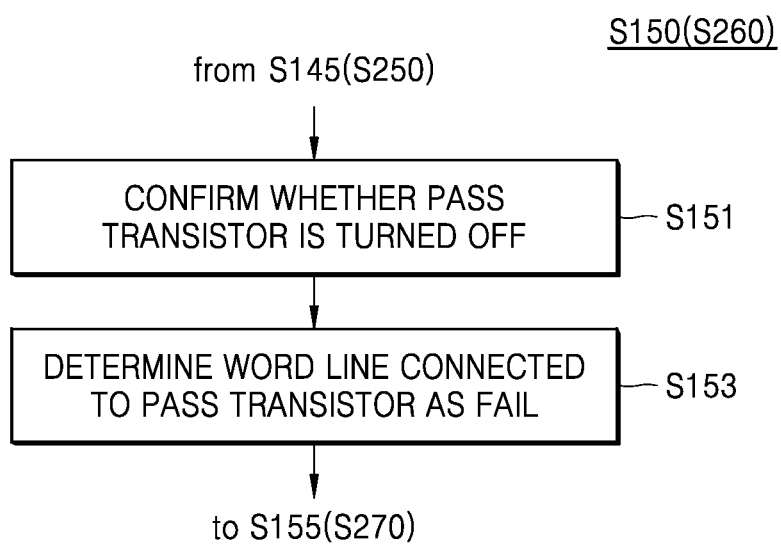
FIG. 7 is a flowchart for describing a fail detecting method of a nonvolatile memory device according to an embodiment of the inventive concept.

FIG. 7 is a flowchart for describing a fail detecting method of the nonvolatile memory device according to an embodiment of the inventive concept. FIG. 7 is a flowchart for describing operation S150 of FIG. 4A and operation S260 of FIG. 4B in further detail. Refer to FIGS. 1 and 3 in conjunction with FIG. 7.

In operation S151 after operation S145 (or operation S250) is performed, the turn-off of the transistor 121 due to the generation of the leakage current may be recognized. The turning-off of the pass transistor 121 may be performed by floating the pass transistor 121 as the leakage voltage Vleak increases to be greater than the overdrive voltage (in other words, Vgs–Vth).

In operation S153, the fail detector 163 or 230 may determine the word line WL, which is connected to the pass transistor 121 that is floated, as a fail. In this case, as described above, the information of memory cell connected to the word line WL determined as a fail may be stored in the address region 111 or processed by firmware that operates at the outside. Afterwards, the method may proceed to operation S155 (or operation S270).

Figure 8:
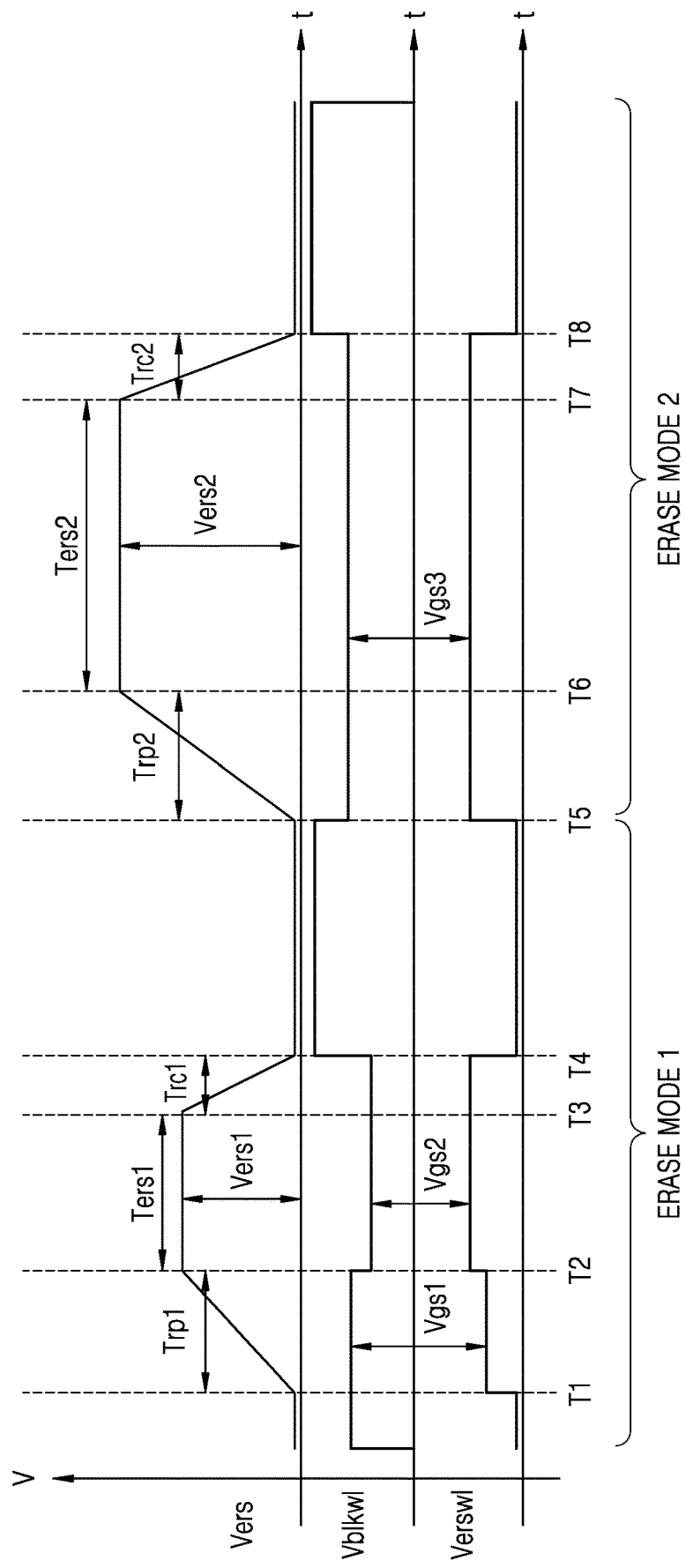
FIG. 8 is a graph showing voltages applied to a pass transistor and a memory cell, according to an embodiment of the inventive concept, according to time.

FIG. 8 is a graph showing voltages applied to a pass transistor and a memory cell according to an embodiment of the inventive concept, according to time. In the graph shown in FIG. 8, a horizontal axis indicates time, and a vertical axis indicates voltage. In FIG. 8, the erase voltage Vers that is a voltage applied to the memory cell, and the block word line voltage Vblkwl and the erase word line voltage Verswl among the word line voltages Vwl applied to the pass transistor 121, are illustrated with respect to a same time axis. Refer to FIGS. 2 and 3 in conjunction with FIG. 8.

At time point T1, as the first erase mode is entered, the erase voltage Vers may be constantly ramped. A ramping period of the erase voltage Vers constantly ramped between the time point T1 and time point T2 is a first ramping period Trp1. The pass transistor 121 is already activated due to repeated operations of the memory cell, and therefore, the block word line voltage Vblkwl provided to the gate terminal S of the pass transistor 121 may maintain the previous voltage level. On the other hand, as the first erase mode is entered, the erase word line voltage Verswl may be shifted to a level higher than a low level. For example, the erase word line voltage Verswl may have a first high level between the time point T1 and the time point T2. Between the time point T1 and the time point T2, the gate-source potential difference Vgs may maintain the first value Vgs1.

At the time point T2, the erase voltage Vers, which reaches a first voltage level Vers1 corresponding to the first erase mode, may maintain a voltage level at the time point T2. The voltage level of the erase voltage Vers may be constantly maintained as a first level Vers1 between the time point T2 and time point T3, which is referred to as a first erase period Ters1. In other words, for the first erase period Ters1, the erase operation of the nonvolatile memory device 100 according to the first erase mode may be performed. The block word line voltage Vblkwl may decrease after reaching the time point T2, or alternatively, the erase word line voltage Verswl may increase after reaching the time point T2. In FIG. 7, for convenience of explanation, a decrease in the block word line voltage Vblkwl and an increase in the erase word line voltage Verswl are illustrated at the same time. However, as described above, an embodiment of the inventive concept may include a change in only one of the block word line voltage Vblkwl and the erase word line voltage Verswl. As a result, the gate-source potential difference Vgs may decrease from the first value Vgs1 to a second value Vgs2.

At the time point T3, the erase voltage Vers may constantly decrease and recover the voltage level before entering the first erase mode. A period in which the erase voltage Vers drops and recovers the previous voltage level is a first recovery period Trc1. Between the time point T3 and time point T4, voltage levels of the block word line voltage Vblkwl and the erase word line voltage Verswl may be maintained.

At the time point T4, the erase voltage Vers may maintain a low level. For verification of the erase operation according to the first erase mode, the block word line voltage Vblkwl may increase, and the erase word line voltage Verswl may decrease. In other words, between the time point T4 and time point T5, the verification operation on the erase operation according to the first erase mode may be performed.

At the time point T5, as the second erase mode is entered, the erase voltage Vers may be constantly ramped. A ramping period of the erase voltage Vers constantly ramped between time point T5 and time point T6 is a second ramping period Trp2. In embodiments of the inventive concept, the ramping periods in the first erase mode and the second erase mode may be different from each other.

At time point T6, the erase voltage Vers, which reaches a second level Vers2 corresponding to the second erase mode, may maintain the voltage level at time point T2. A maintenance period of the erase voltage Vers constantly maintained between time point T6 and time point T7 is a second erase period Ters2. In an embodiment of the inventive concept, the second voltage level Ver2 may be different from the first voltage level Vers1, and the second erase period Ters2 may be different from the first erase period Ters1. In other words, for the second erase period Ters2, the normal erase operation of the nonvolatile memory device 100 according to the second erase mode may be performed.

At time point T7, the erase voltage Vers may constantly decrease and recover the voltage level before entering the second erase mode. A period in which the erase voltage Vers decreases and recovers the previous voltage level is a second recovery period Trc2. In an embodiment of the inventive concept, the second recovery period Trc2 may be different from the first recovery period Trc1. The block word line voltage Vblkwl may decrease after reaching the time point T5, or alternatively, the erase word line voltage Verswl may increase after reaching the time point T5. For example, the erase word line voltage Verswl may have a third high level between the time point T5 and the time point T8. In FIG. 8, for convenience of explanation, a decrease in the block word line voltage Vblkwl and an increase in the erase word line voltage Verswl are illustrated at the same time. However, as described above, an embodiment of the inventive concept may include a change in only one of the block word line voltage Vblkwl and the erase word line voltage Verswl.

Between the time point T5 and time point T8, the block word line voltage Vblkwl and the erase word line voltage Verswl each provided to the gate terminal S of the pass transistor 121 may maintain the previous voltage level. For example, between the time point T5 and time point T8, the gate-source potential difference Vgs may maintain a third value Vgs3, and this may be different from the decrease in the gate-source potential difference Vgs in the first erase mode.

Figure 9:
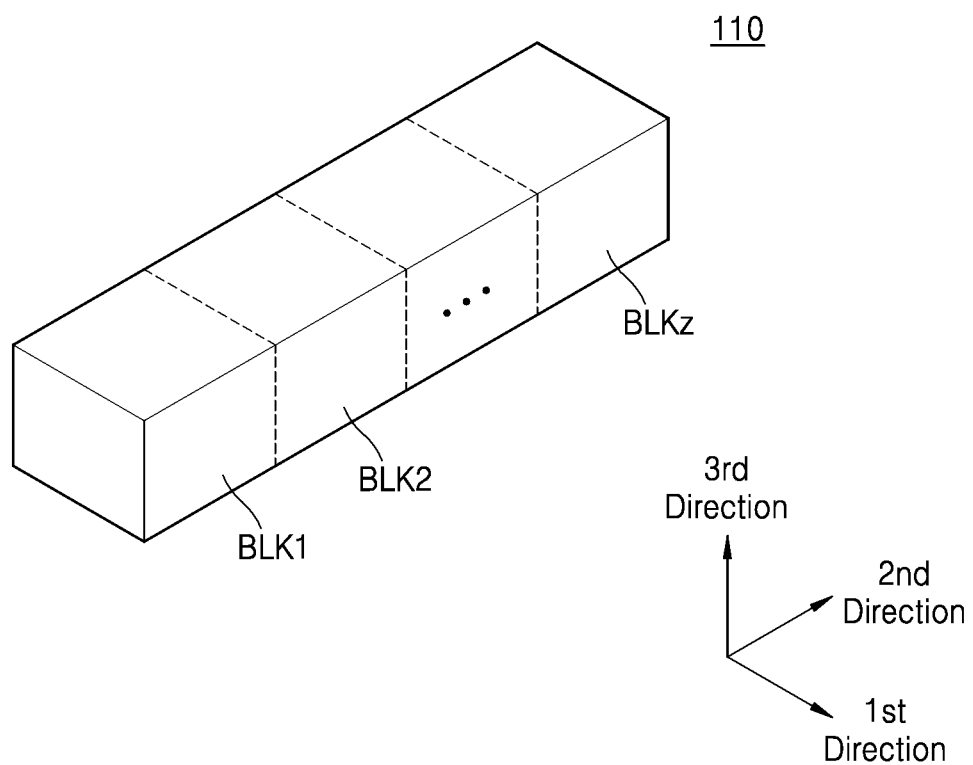
FIG. 9 is a diagram of a memory cell array according to an embodiment of the inventive concept.

FIG. 9 is a diagram of the memory cell array 110 according to an embodiment of the inventive concept.

The memory cell array 110 may include a plurality of memory blocks BLK1 through BLKz. Each of the memory blocks BLK1 through BLKz may have a three-dimensional structure (or a vertical structure). For example, each of the memory blocks BLK1 through BLKz may include structures extending in first, second and third directions. Each of the memory blocks BLK1 through BLKz may include a plurality of cell strings extending in the second direction. The plurality of cell strings may be apart from one another in the first direction and the third direction. Cell strings in one memory block are connected to the plurality of bit lines BLs, a plurality of string selection lines SSL, the plurality of word lines, one ground selection line or a plurality of ground selection lines GSL, and a common source line. The cell strings in the plurality of memory blocks BLK1 through BLKz may share a plurality of bit lines BLs. For example, the plurality of bit lines BLs may extend in the second direction and be shared in the plurality of memory blocks BLK1 through BLKz.

The memory blocks BLK1 through BLKz may be selected by the row decoder 120 shown in FIG. 1. For example, the row decoder 120 may be configured to select a memory block corresponding to the received address ADDR among the memory blocks BLK1 through BLKz. The program operation, the read operation, and the erase operation may be performed in the selected memory block.

Figure 10A:
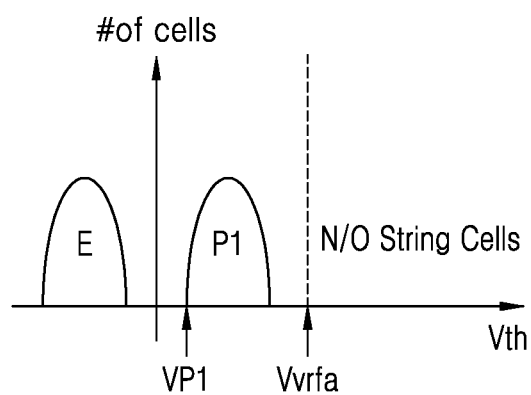
FIGS. 10A, 10B and 10C are graphs for describing an erasing operation of a nonvolatile memory device according to an embodiment of the inventive concept.
Figure 10B:
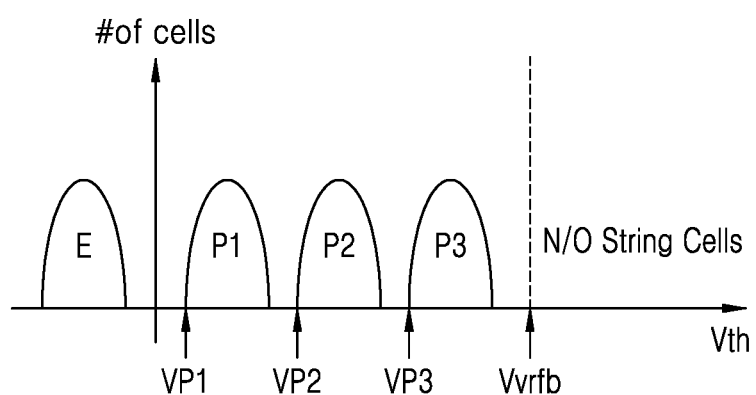
Figure 10C:
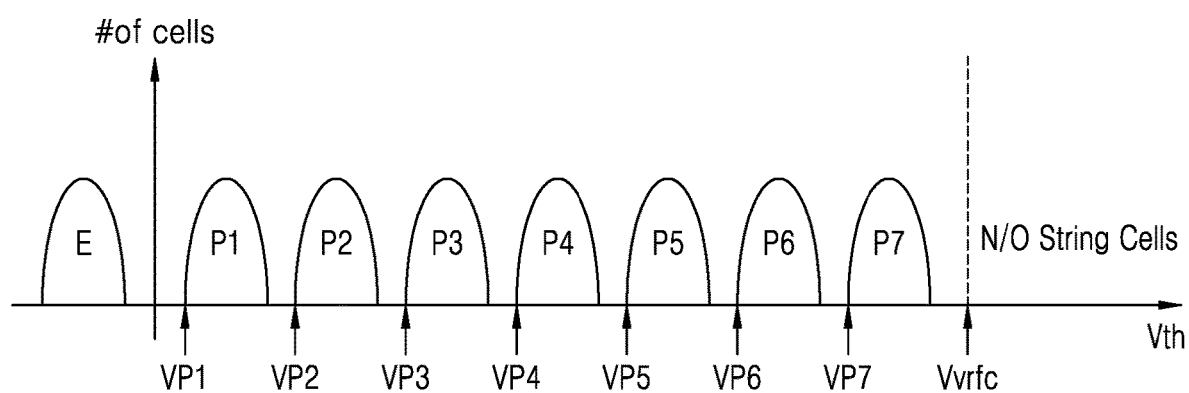

FIGS. 10A through 10C are graphs for describing an erasing operation of a nonvolatile memory device according to an embodiment of the inventive concept. A horizontal axis of the graphs indicates the threshold voltage Vth, and a vertical axis indicates the number of cells that operate. Refer to FIGS. 1 through 3 and 8 in conjunction with FIGS. 10A through 10C.

Referring to FIG. 10A, when the memory cell type is single-level cell (SLC), the memory cells may correspond to any one of an erase state E and a first program state P1. Channels are not formed in not-open (N/O) string cells included in N/O strings that are generated due to the leakage current, and accordingly, it may be seen that the N/O memory cells have a threshold voltage greater than a threshold voltage of a memory cell in a highest program state P1, regardless of an actual threshold voltage. Accordingly, a verify voltage Vvrfa may have a level higher than that of a reference value VP1 for verifying a highest program state P1.

Referring to FIG. 10B, when the memory cell type is a multi-level cell (MLC), the memory cells may correspond to any one of the erase state E and the first program state P1 through a third program state P3. As channels are not formed in the memory cells included in the N/O string, it may be considered that the memory cells included in the N/O string have a threshold voltage greater than a threshold voltage of the memory cell in a highest program state P3. Accordingly, a verify voltage Vvrfb may have a level higher than that of a reference voltage VP3 for verifying a highest program state P3.

Referring to FIG. 10C, when the memory cell type is a triple level cell (TLC), the memory cells may correspond to any one of the erase state E, the first program state P1 through the seventh program state P7, and as channels are not formed in the memory cells included in the N/O strings, the memory cells included in the not-open string may be recognized as having a threshold voltage that is greater than that of a threshold voltage of a memory cell in a highest program state P7. Accordingly, a verify voltage Vvrfc may have a level that is higher than that of a reference voltage VP7 for verifying a highest program state P7.

Figure 11:
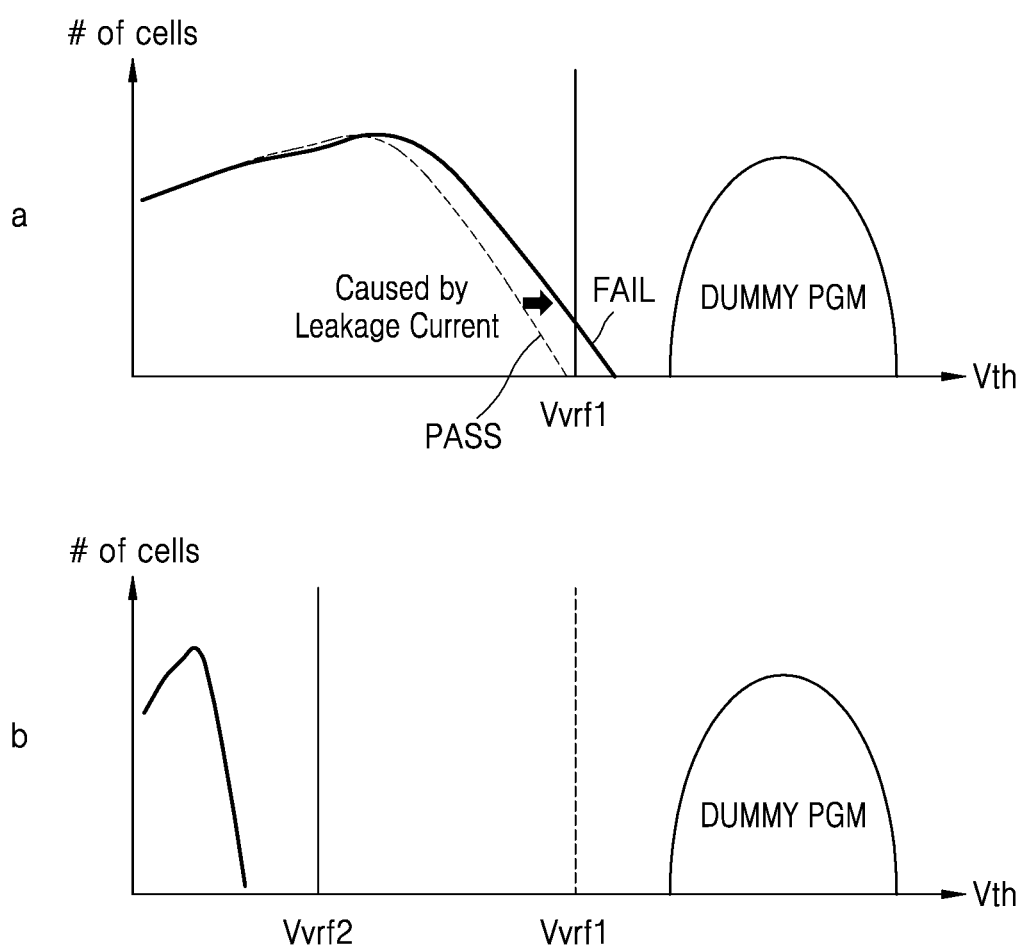
FIG. 11 includes graphs (a) and (b) for describing erasing operations of a nonvolatile memory device according to an embodiment of the inventive concept.

(a) and (b) of FIG. 11 are graphs for describing erasing operations of a nonvolatile memory device according to an embodiment of the inventive concept. The graph in FIG. 11 is illustrated in comparison with FIGS. 10A through 10C. Refer to FIGS. 1 through 3 and 10A through 10C in conjunction with FIG. 11.

Referring to (a) of FIG. 11, as the first erase mode is entered, a dummy voltage for verification may be programmed. The programmed dummy voltage may be higher than the first verify voltage Vvrf1. According to an embodiment of the inventive concept, in the first erase mode, the erase word line voltage Verswl may increase. As the first verify voltage Vvrf1 for detecting the leakage current may be greater than an upper limit of the erase word line voltage Verswl, when the leakage voltage Vleak caused due to the generation of the leakage current is not generated, the corresponding word line may be determined as normal. However, when the leakage voltage that is generated exceeds the first threshold value (for example, the overdrive voltage), an increase in an electrical potential due to the leakage voltage Vleak further occurs in the erase word line voltage Verswl, and therefore, a voltage increase over the first verify voltage Vvrf1 may be detected. In this case, the fail detector 163 may determine the corresponding word line WL as a fail.

Referring to (b) of FIG. 11, as the second erase mode is entered, the erase word line voltage Verswl may decrease. In this case, while it may vary according to memory types (for example, SLC, MLC, and TLC) of the memory cell array 110, an operation for normally erasing the memory cell may be performed. In this case, the second verify voltage Vvrf2 lower than the first verify voltage Vvrf1 may be used for the erase operation.

FIG. 12 is a table for describing the erase operation of the nonvolatile memory device 100 according to an embodiment of the inventive concept.

According to Case 1, when the erase operation according to the first erase mode is performed but a fail is not detected (PASS), the erase operation according to the second erase mode may be successively performed. When a fail is not detected in the first erase mode and the second erase mode (PASS), it may be interpreted that the leakage current is not detected, and as a result, it may be understood that the leakage current flowing on an adjacent string on the memory cell array is not generated (PASS).

According to Case 2, when a fail is not detected (PASS) in the first erase mode but is detected (FAIL) in the second erase mode, it may be interpreted that the leakage current is generated but is not properly detected. According to an embodiment of the inventive concept, a case in which the leakage current is not detected despite a decrease in the gate-source potential difference Vgs may be referred to as an uncorrectable error (UECC).

According to Case 3, when the fail is detected in the first erase mode (FAIL), the memory block connected to the corresponding word line WL may be determined as a bad block. As a result, reliability of the data may be increased by taking measures not to use the memory block in which the fail occurred, before the data is newly written.

Figure 13A:
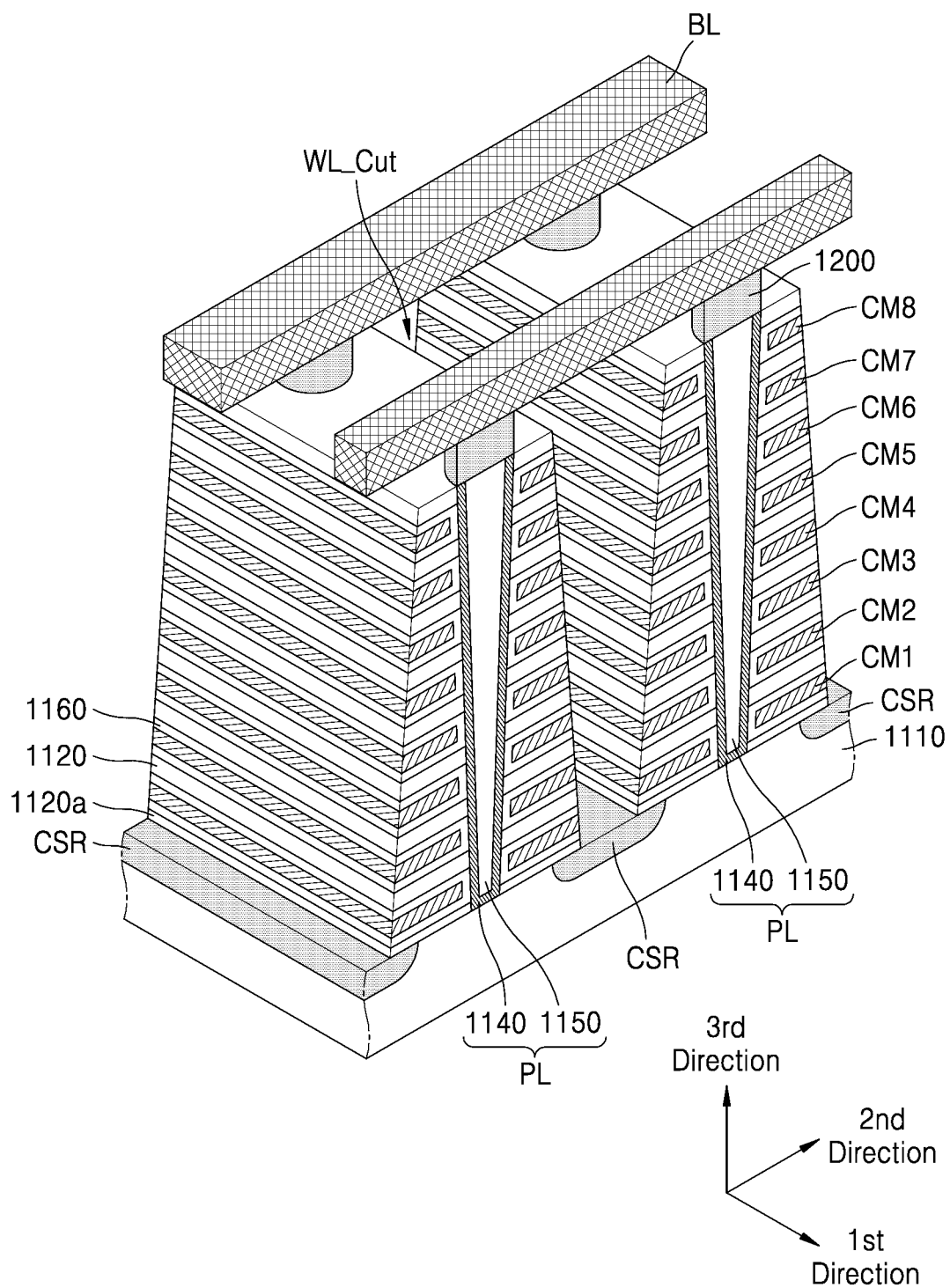
FIGS. 13A and 13B illustrate perspective cross-sectional views of a memory cell array according to an embodiment of the inventive concept.
Figure 13B:
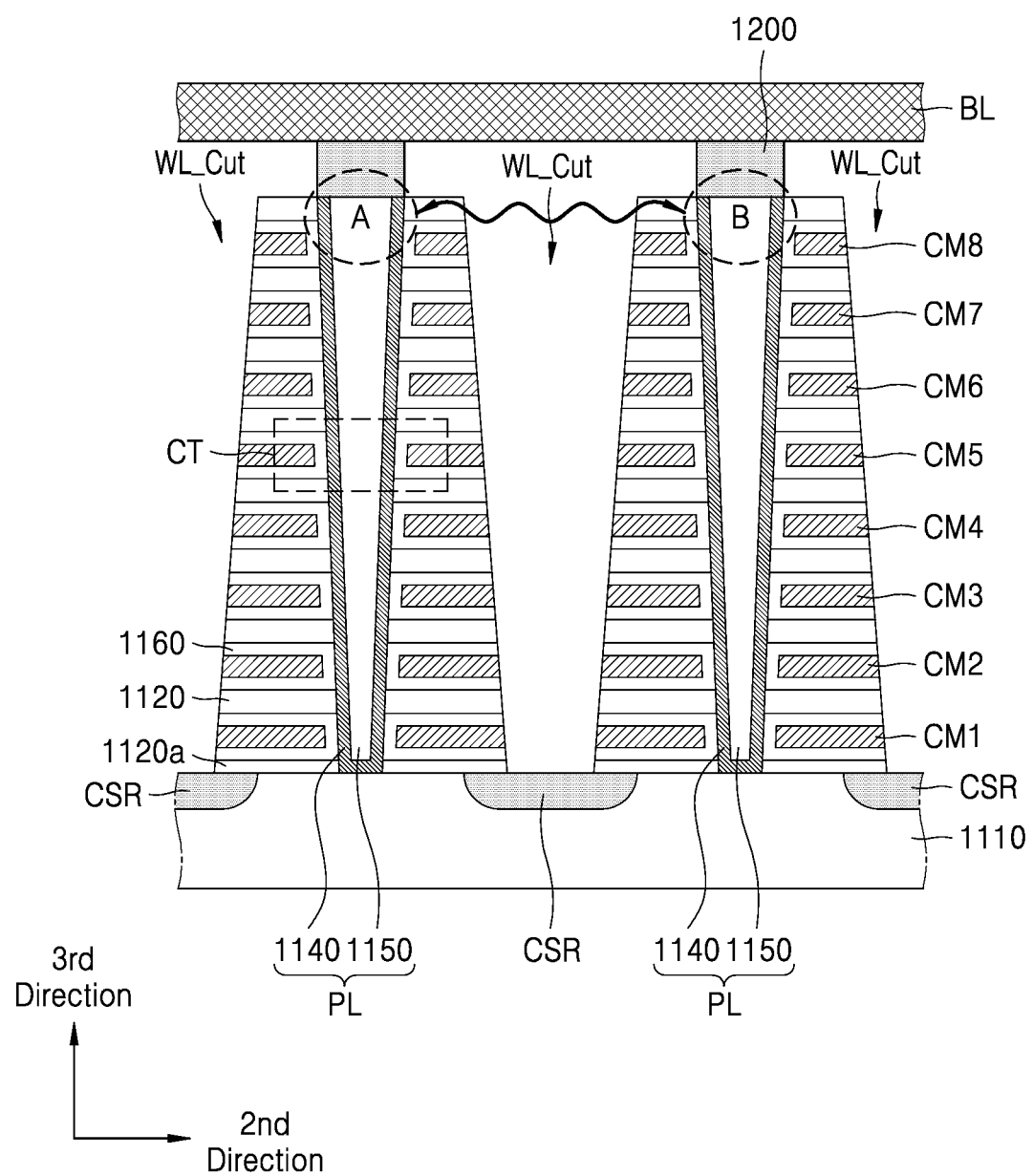

FIGS. 13A and 13B are perspective cross-sectional views of the memory cell array 110 according to an exemplary embodiment of the inventive concept. Refer to FIGS. 13A and 13B in conjunction with FIG. 1.

Further referring to FIGS. 13A and 13B, a substrate 1110 is provided. Illustratively, the substrate 1110 may be a well having a first conductive type. A plurality of common source regions CSR extending in the first direction and apart from one another in the second direction may be provided on the substrate 1110. The plurality of common source regions CSR may be connected in common and construct the common source line. The plurality of common source regions CSR have a second conductive type different from that of the substrate 1110. Between two adjacent common source regions CSR among the plurality of common source regions CSR, a plurality of insulating materials 1120 and 1120a may be sequentially provided on the substrate 1110 in the third direction (in other words, a direction perpendicular or substantially perpendicular to the substrate 1110). The plurality of insulating materials 1120 and 1120a may be apart from each other in the third direction. The plurality of insulating materials 1120 and 1120a may extend in the first direction.

Between two common source regions CSR adjacent to each other, there may be provided a plurality of pillars PL that are sequentially arranged in the first direction and penetrating the plurality of insulating materials 1120 and 1120a in the second direction. For example, the plurality of pillars PL may penetrate through the insulating materials 1120 and 1120a and be in contact with the substrate 1110. For example, between the two common source regions CSR adjacent to each other, the pillars PL may be apart from each other in the first direction. The pillars PL may be arranged in a row in the first direction.

For example, the plurality of pillars PL may include a plurality of pillars. For example, the pillars PL may include channel films 1140 and internal materials 1150. The channel films 1140 may include a semiconductor material having the first conductive type (for example, silicon). The channel films 1140 may include a semiconductor material (for example, silicon) having a same conductive type as that of the substrate 1110. The channel films 1140 may include an intrinsic semiconductor that does not have a conductive type.

The internal materials 1150 may include an insulating material. For example, the internal materials 1150 may include an insulating material such as silicon oxide. For example, the internal materials 1150 may include air gaps. Between the two common source regions CSR adjacent to each other, information storage films 1160 may be provided on exposed surface of the insulating materials 1120 and 1120a and the pillars PL. The information storage films 1160 may store information by trapping and leaking electric charges.

Between the two common source regions CSR adjacent to each other and between the insulating materials 1120 and 1120a, conductive materials CM1 through CM8 are provided on exposed surfaces of the information storage films 1160. The conductive materials CM1 through CM8 may extend in the first direction. On the common source regions CSR, the conductive materials CM1 through CM8 may be separated by word line cuts WL cuts. Word line cuts WL Cuts may expose the common source regions CSR. The word line cuts WL Cuts may extend in the first direction. For example, the conductive materials CM1 through CM8 may include a metallic conductive material. The conductive materials CM1 through CM8 may include a non-metallic conductive material such as polysilicon.

For example, the information storage films 1160, which are provided on top surfaces of insulating materials at uppermost portions among the insulating materials 1120 and 1120a, may be removed. For example, the information storage films 1160, which are provided on lateral surfaces corresponding to the pillars PLs among the lateral surfaces of the insulating materials 1120 and 1120a, may be removed.

A plurality of drains 1200 may be provided on the plurality of pillars PL. Illustratively, the drains 1200 may include a semiconductor material having a second semiconductor type (for example, silicon). For example, the drains 1200 may include a semiconductor material having an Nth conductive type (for example, silicon).

The bit lines BLs extending in the second direction and apart from one another in the first direction may be provided on the drains 1200. The bit lines BL are connected to the drains 1200. Illustratively, the drains 1200 and the bit lines BL may be connected through contact plugs. For example, bit lines BL may include metallic conductive materials. For example, the bit lines BL may include non-metallic conductive materials such as polysilicon. The conductive materials CM1 through CM8 may have first through eighth heights according to an order from the substrate 1110.

The plurality of pillars PLs may form a plurality of strings together with the information storage films 1160 and the plurality of conductive materials CM1 through CM8. The plurality of pillars PLs may each form a string together with each of the information storage films 1160 and each of the adjacent conductive materials CM1 through CM8. On the substrate 1110, the pillars PL may be provided in a row direction and a column direction. The eighth conductive materials CM8 may construct rows. Pillars connected to one same eighth conductive material may construct a row. The bit lines BLs may construct columns. Pillars connected to one same bit line BL may construct a column. The pillars PLs, together with the information storage films 1160 and the plurality of conductive materials CM1 through CM8, construct the plurality of strings arranged in the row direction and the column direction. Each of the strings may include a plurality of cell transistors CT (or memory cells) stacked in a direction perpendicular or substantially perpendicular to the substrate.

A leakage current may be generated between portion A and portion B shown in FIG. 13B. Due to a physical property of generating strings perpendicular or substantially perpendicular to the substrate 1110, a diameter (or a width) of the pillar PL may increase upwards in a three-dimensional direction. Due to tendency of the memory technology of fine processing, intervals between the pillars PLs may gradually increase, and accordingly, a not-open string may be formed when the pillar PL in portion A and the pillar PL in portion B come into contact. As the not-open string is formed, the leakage current generated from the voltage applied to one pillar PL may flow to another pillar PL. For example, the leakage current may flow from portion A to portion B, or from portion B to portion A.

Figure 14:
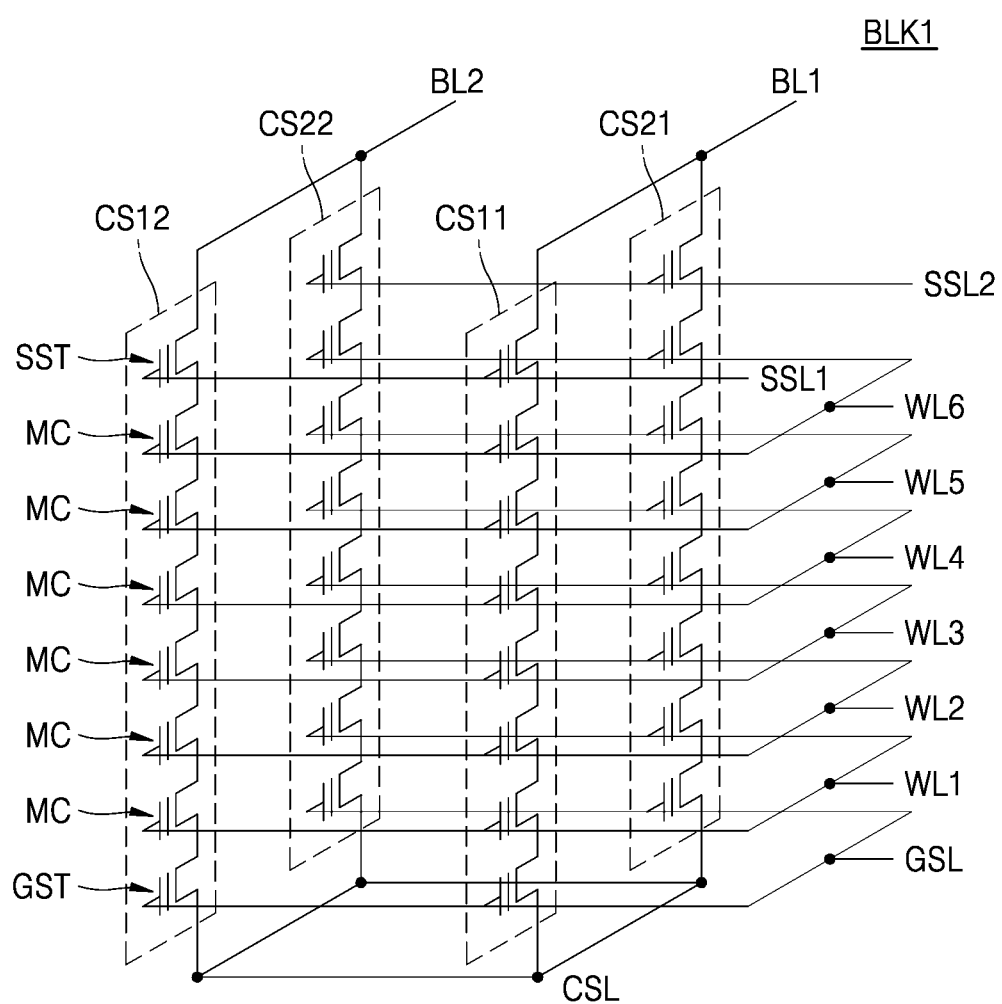
FIG. 14 is a diagram of a memory cell included in a memory block according to an embodiment of the inventive concept.

FIG. 14 is a diagram of an equivalent circuit of a memory cell of the memory block BLK1 according to an embodiment of the inventive concept. Refer to FIGS. 1 and 8 in conjunction with FIG. 14.

Referring to FIG. 14, cell strings CS11, CS12, CS21, and CS22 may be between bit lines BL1 and BL2 and the common source line CSL. The cell strings CS11 and CS21 may be connected between a first bit line BL1 and the common source line CSL. The cell strings CS12 and CS22 may be connected between a second bit line BL2 and the common source line CSL. The common source regions CSR (see FIG. 14B) are connected in common and construct the common source line CSL.

Memory cells MC having a same height are connected to a word line in common (e.g., WL1 to WL6), and when a voltage is provided to a word line having a particular height, the voltage may be provided to all of the cell strings CS11, CS12, CS21, and CS22. Strings in different rows may be respectively connected to different string selection lines SSL1 and SSL2. By selecting and not selecting the first string selection line SSL1 and the second string selection line SSL2, the cell strings CS11, CS12, CS21, and CS22 may be selected and not selected in a row unit. For example, the cell strings CS11 and CS12 or CS21 and CS22 connected to the non-selected string selection line SSL2 or SSL2 may be electrically separated from the bit lines BL1 and BL2. The cell strings CS21 and CS22 or CS11 and CS12 connected to the selected string selection line SSL2 or SSL1 may be electrically connected to the bit lines BL1 and BL2.

The cell strings CS11, CS12, CS21, and CS22 may be connected to the bit lines BL1 and BL2 in a column unit. The cell strings CS11 and CS21 may be connected to the first bit line BL1, and the strings CS12 and CS22 may be connected to the second bit line BL2. By selecting and not selecting the bit lines BL1 and BL2, the cell strings CS11, CS12, CS21, and CS22 may be selected and not selected in a column unit. FIG. 14 also shows a string selection transistor SST connected to the string selection line SSL1 and a ground selection transistor GST connected to a ground selection line GSL.

Figure 15:
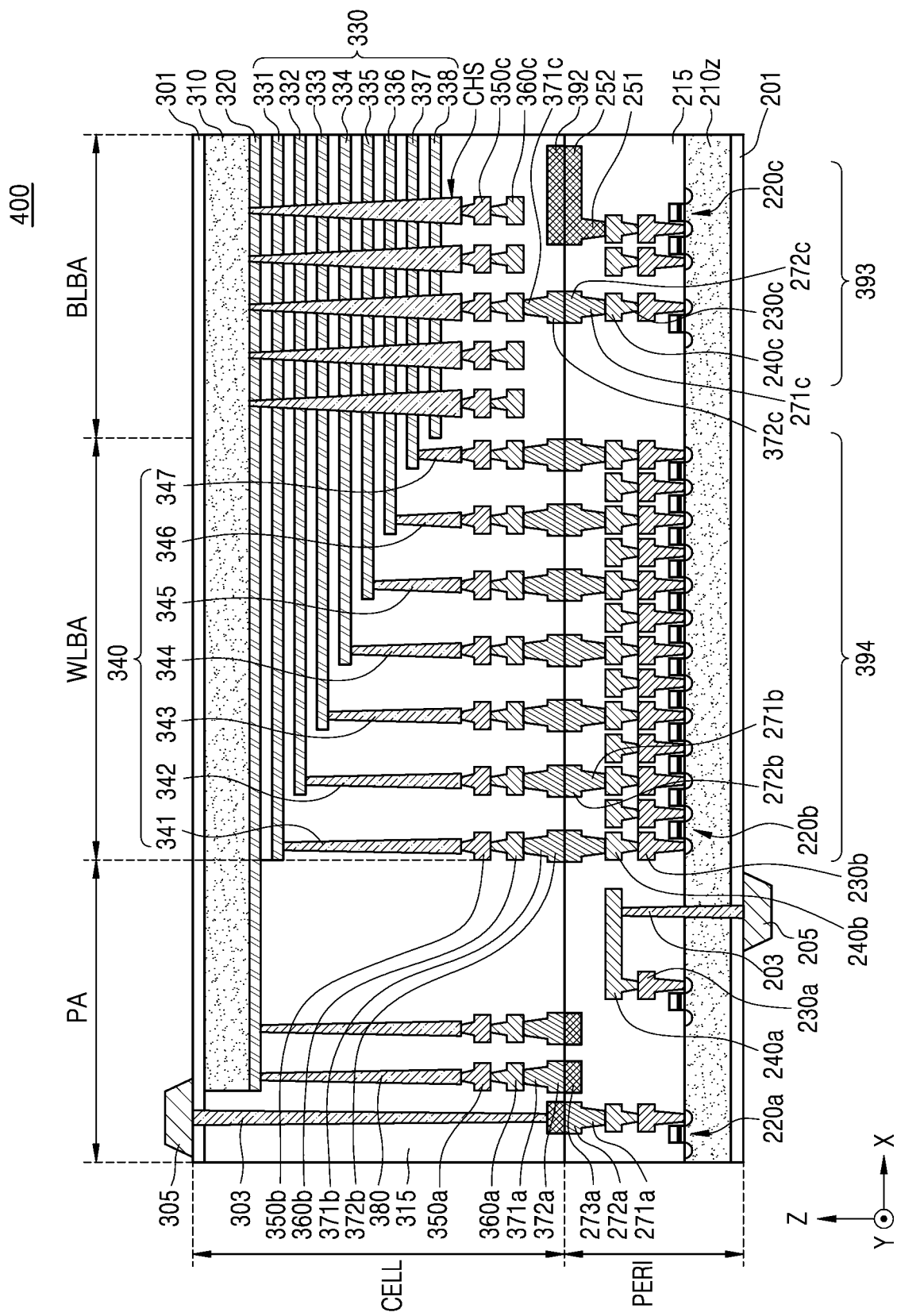
FIG. 15 is a diagram for describing a Chip to Chip (C2C) structure applied to a memory device according to an embodiment of the inventive concept.

FIG. 15 is a diagram for describing a Chip to Chip (C2C) structure applied to a memory device 400 according to an embodiment of the inventive concept.

Referring to FIG. 15, the memory device 400 may have a C2C structure. The C2C structure may indicate manufacturing a top chip on a first wafer, the top chip including a cell region CELL, manufacturing a bottom chip on a second wafer that is different from the first wafer, the bottom chip including a peripheral region PERI, and then connecting the top chip and the bottom chip by a bonding method. For example, the bonding method may be a method of electrically connecting a bonding metal, which is formed on an uppermost metal layer of the top chip, and a bonding metal formed on an uppermost metal layer of the bottom chip. For example, when the bonding metal includes copper (Cu), the bonding method may be a Cu—Cu bonding method, and the bonding metal may also include aluminum or tungsten.

A peripheral circuit region PERI and a cell region CELL in the memory device 400 may each include an external pad bonding area PA, a word line bonding area WLBA, and a bit line bonding area BLBA.

The peripheral circuit region PERI may include a first substrate 210z, an interlayer insulating layer 215, a plurality of circuit elements 220a, 220b, and 220c formed on the first substrate 210z, first metal layers 230a, 230b, and 230c respectively connected to the plurality of circuit elements 220a, 220b, and 220c, and second metal layers 240a, 240b, and 240c formed on the first metal layer 230a, 230b, and 230c. In an embodiment of the inventive concept, the first metal layers 230a, 230b, and 230c may include tungsten that has a relatively high resistance, and the second metal layers 240a, 240b, and 240c may include copper that has a relatively low resistance.

Only the first metal layers 230a, 230b, and 230c and the second metal layers 240a, 240b, and 240c are illustrated and described in the present specification, but the inventive concept is not limited thereto, and at least one metal layer may be further formed on the second metal layers 240a, 240b, and 240c. At least a portion of the one or more metal layers formed on the second metal layers 240a, 240b, and 240c may include, for example, aluminum that has a resistance higher than that of copper included in the second metal layer 240a, 240b, and 240c.

The interlayer insulating layer 215 is arranged on the first substrate 210z to cover the plurality of circuit elements 220a, 220b, and 220c, the first metal layers 230a, 230b, and 230c, and the second metal layers 240a, 240b, and 240c, and may include an insulating material such as silicon oxide, silicon nitride, and the like.

Lower bonding metals 271b and 272b may be formed on the second metal layer 240b of the word line bonding area WLBA. In the word line bonding area WLBA, the lower bonding metals 271b and 272b in the peripheral circuit region PERI may be electrically connected to upper bonding metals 371b and 372b in the cell region CELL by a bonding method, and the lower bonding metals 271b and 272b and the upper bonding metals 371b and 372b may include aluminum, copper, tungsten, or the like.

The cell region CELL may provide at least one memory block. The cell region CELL may include a second substrate 310 and a common source line 320. On the second substrate 310, a plurality of word lines 331 through 338 (collectively denoted by reference numeral 330) may be stacked in a direction perpendicular or substantially perpendicular (the Z axis direction) to a top surface of the second substrate 310. String selection lines and a ground selection line may be on and below each of the word lines 330, and the plurality of word lines 330 may be between the string selection lines and the ground selection line.

In the bit line bonding area BLBA, a channel structure CH may extend in the direction perpendicular or substantially perpendicular to the top surface of the second substrate 310 and penetrate through the word lines 330, the string selection lines, and the ground selection line. The channel structure CH may include a data storage layer, a channel layer, a buried insulating layer, and the like, wherein the channel layer may be electrically connected to a first metal layer 350c and a second metal layer 360c. For example, the first metal layer 350c may include a bit line contact, and the second metal layer 360c may include a bit line. In an embodiment of the inventive concept, the second metal layer 360c may extend in the first direction (the Y axis direction) parallel to the top surface of the second substrate 310.

In the embodiment shown in FIG. 15, a region in which the channel structure CH, the second metal layer 360c, and the like are arranged may be referred to as the bit line bonding area BLBA. In the bit line bonding area BLBA, the second metal layer or the bit line 360c may be electrically connected to the circuit elements 220c providing a page buffer 393 in the peripheral circuit region PERI. For example, the bit line 360c is connected to the upper bonding metals 371c and 372c in the peripheral circuit region PERI, and the upper bonding metals 371c and 372c may be connected to lower bonding metals 271c and 272c connected to the circuit element 220c of the page buffer 393.

In the word line bonding area WLBA, the word lines 330 may extend in the second direction (the X axis direction) parallel to the top surface of the second substrate 310, and may be connected to a plurality of cell contact plugs 341 through 347 collectively denoted by reference numeral 340. The word lines 330 and the cell contact plugs 340 may be connected to one another by pads that are provided by extension of at least some of the word lines 330 to different lengths in the second direction. First metal layer 350b and second metal layer 360b may be sequentially connected to each of top portions of the cell contact plugs 340 that are connected to the word lines 330. In the word line bonding area WLBA, the cell contact plugs 340 may be connected to the peripheral circuit region PERI through the upper bonding metals 371b and 372b in the cell region CELL and the lower bonding metals 271b and 272b in the peripheral circuit region PERI.

The cell contact plugs 340 may be electrically connected to the circuit elements 220b providing a row decoder 394 in the peripheral circuit region PERI. In an embodiment of the inventive concept, an operation voltage of the circuit elements 220b providing the row decoder 394 may be different from an operation voltage of the circuit elements 220 providing the page buffer 393. For example, an operation voltage of the circuit elements 220c providing the page buffer 393 may be greater than the operation voltage of the circuit elements 220b providing the row decoder 394. In an embodiment, the voltage generator and the control logic may be included in the peripheral circuit region PERI.

A common source line contact plug 380 may be in the external pad bonding area PA. The common source line contact plug 380 includes a conductive material such as a metal, a metal compound, polysilicon and the like, and may be electrically connected to the common source line 320. A first metal layer 350a and a second metal layer 360a may be sequentially stacked on the common source line contact plug 380. For example, a region in which the common source line contact plug 380, the first metal layer 350a, and the second metal layer 360a are arranged may be referred to as the external pad bonding area PA.

Input/output (I/O) pads 205 and 305 may be in the external pad bonding area PA. Referring to FIG. 15, a lower insulating film 201 covering a bottom surface of the first substrate 210z may be formed below the first substrate 210z, and a first I/O pad 205 may be formed on the lower insulating film 201. The first I/O pad 205 is connected to at least one of the plurality of circuit elements 220a, 220b, and 220c in the peripheral circuit region PERI through first I/O contact plugs 203, and may be separated from the first substrate 210z by the lower insulating film 201. In addition, a lateral insulating film is between the first I/O contact plug 203 and the first substrate 210z to electrically separate the first I/O contact plug 203 from the first substrate 210z.

Referring to FIG. 15, an upper insulating film 301 covering the top surface of the second substrate 310 may be formed on the second substrate 310, and a second I/O pad 305 may be on the upper insulating film 301. The second I/O pad 305 may be connected, through a second I/O contact plug 303, to at least one of the plurality of circuit elements 220a, 220b, and 220c arranged in the peripheral circuit region PERI.

According to embodiments of the inventive concept, the second substrate 310, the common source line 320, and the like may not be arranged in the region in which the second I/O contact plug 303 is arranged. In addition, the second I/O pad 305 may not overlap the word lines 330 in the third direction (the Z axis direction). Referring to FIG. 15, the second I/O plug 303 is separated from the second substrate 310 in a direction parallel to the top surface of the second substrate 310, and may penetrate through interlayer insulating layer 315 in the cell region CELL and be connected to the second I/O pad 305.

According to embodiments of the inventive concept, the first I/O pad 205 and the second I/O pad 305 may be selectively formed. For example, the memory device 400 may only include the first I/O pad 205 on the first substrate 210z, or may only include the second I/O pad 305 on the second substrate 310. Alternatively, the memory device 400 may include both the first I/O pad 205 and the second I/O pad 305.

In each of the external pad bonding area PA and the bit line bonding area BLBA included in each of the cell region CELL and the peripheral circuit region PERI, the metal patterns on the uppermost metal layers may exist as dummy patterns, or the uppermost metal layers may be hollow.

In the memory device 400, in the external pad bonding area PA, a lower metal pattern 273a having a same shape as that of an upper metal pattern 372a in the cell region CELL may be formed on an uppermost metal layer of the peripheral circuit region PERI, to correspond to upper metal patterns 371a and 372 formed on an uppermost metal layer in the cell region CELL. The second metal layer or bit line 360a may be connected to the upper metal patterns 371a and 372a, and the upper metal patterns 371a and 372a may be connected to lower metal patterns 273a. The lower metal pattern 273a formed on the uppermost metal layer of the peripheral circuit region PERI may not be connected to a separate contact in the peripheral circuit region PERI. Similarly, in the external pad bonding area PA, an upper metal pattern having a same shape as that of the lower metal pattern in the peripheral circuit region PERI may be formed on an upper metal layer of the cell region CELL, to correspond to the lower metal pattern formed on the uppermost metal layer of the peripheral circuit region PERI.

The lower bonding metals 271b and 272b may be formed on the second metal layer 240b in the word line bonding area WLBA. In the word line bonding area WLBA, the lower bonding metals 271b and 272b in the peripheral circuit region PERI may be electrically connected to the upper bonding metals 371b and 372b in the cell region by a bonding method.

In addition, in the bit line bonding area BLBA, an upper metal pattern 392 having a same shape as that of a lower metal pattern 252 in the peripheral circuit region PERI may be formed on the uppermost metal layer in the cell region CELL, to correspond to the lower metal pattern 252 formed on the uppermost metal layer in the peripheral circuit region PERI. A contact may not be formed in the upper metal pattern 392 formed in the uppermost metal layer in the cell region CELL.

While the inventive concept has been particularly shown and described with reference to embodiments thereof, it will be understood that various changes in form and detail may be made thereto without departing from the spirit and scope of the inventive concept as set forth in the following claims.

What is claimed is:
1. A fail detecting method of a memory system comprising a nonvolatile memory device and a memory controller, the fail detecting method comprising:
 counting, by the memory controller, the number of erases of a word line connected to a pass transistor;
 issuing a first erase command, by the memory controller, when the number of erases reaches a reference value;
 applying a first voltage, by the nonvolatile memory device, in response to the first erase command, that causes a gate-source potential difference of the pass transistor to have a first value;
 detecting, by the memory controller, a leakage current in the word line, after the applying of the first voltage; and
 determining, by the memory controller, the word line as a fail when a leakage voltage caused by the leakage current is greater than a first threshold value.

2. The fail detecting method of claim 1, wherein the applying of the first voltage comprises increasing a source terminal voltage of the pass transistor.

3. The fail detecting method of claim 1, wherein the applying of the first voltage comprises decreasing a gate terminal voltage of the pass transistor.

4. The fail detecting method of claim 1, further comprising:
applying a second voltage, by the nonvolatile memory device, that causes the gate-source potential difference to have a second value greater than the first value; and
performing an erase operation, by the nonvolatile memory device, on a memory block connected to the word line.

5. The fail detecting method of claim 1, wherein the determining of the word line as a fail comprises:
determining that the pass transistor is turned off; and
identifying a word line, connected to the pass transistor that is turned off, as a fail word line.

6. The fail detecting method of claim 1, further comprising:
applying a dummy voltage to a memory cell connected to the word line, after the number of erases reaches the reference value; and
buffering a program voltage.

7. The fail detecting method of claim 1, wherein the detecting of the leakage current comprises determining that a difference between the gate-source potential difference and a threshold voltage of the pass transistor is less than or equal to the leakage voltage.

8. The fail detecting method of claim 1, wherein the first threshold value is an overdrive voltage.

9. An erase method of a nonvolatile memory device, the erase method comprising:
receiving an erase command;
applying a first voltage, in a first erase mode based on the erase command, that causes a gate-source potential difference of a pass transistor connected to a word line to have a first value;
detecting a leakage current on the word line when the pass transistor is off;
identifying the word line, connected to the pass transistor that is turned off, as a fail word line; and
in a second erase mode, erasing a memory block connected to the word line as a second voltage is applied that causes the gate-source potential difference to have a second value greater than the first value.

10. The erase method of claim 9, wherein the applying of the first voltage further comprises increasing a source terminal voltage of the pass transistor.

11. The erase method of claim 9, wherein the applying of the first voltage further comprises decreasing a gate terminal voltage of the pass transistor.

12. The erase method of claim 9, wherein the first erase mode and the second erase mode are entered by the erase command.

13. The erase method of claim 9, wherein the detecting of the leakage current comprises maintaining an erase voltage applied to a memory cell at a first voltage level, and the erasing of the memory block comprises maintaining the erase voltage at a second voltage level different from the first voltage level.

14. The erase method of claim 9, wherein the detecting of the leakage current further comprises confirming that a source voltage of the pass transistor is higher than a first verify voltage level.

15. The erase method of claim 9, wherein the detecting of the leakage current comprises:
determining that the pass transistor is turned off.

16. The erase method of claim 9, further comprising counting the number of erases of the word line,
wherein the first erase mode is entered when the number of erases reaches a predetermined value.

17. The erase method of claim 16, further comprising:
applying a dummy voltage to the memory block, when the numbers of erases reaches the predetermined value; and
buffering a program voltage.

18. A memory system comprising:
a nonvolatile memory device; and
a memory controller configured to control the nonvolatile memory device,
wherein the nonvolatile memory device comprises:
a memory cell region comprising a first metal pad;
a peripheral region comprising a second metal pad, the peripheral region being connected to the memory cell region through the first metal pad and the second metal pad;
a memory cell array comprising a plurality of memory cells forming a plurality of strings in a direction substantially perpendicular to a substrate, the memory cell array being included in the memory cell region;
wherein the peripheral region further comprises:
a row decoder comprising a pass transistor configured to switch a plurality of word lines connected to the plurality of memory cells, configured to select, through the plurality of word lines, a memory block that is included in the memory cell array;
a voltage generator included in the peripheral region and configured to generate a plurality of voltages provided to the memory cell array and the pass transistor; and
a control logic included in the peripheral region and configured to decrease, based on a first erase command, a gate-source potential difference of the pass transistor to detect a leakage current of a word line in the memory block,
wherein the memory controller is configured to count the number of erases of the memory block, issue the first erase command when the number of erases reaches a reference value, and detect the leakage current.

19. The memory system of claim 18, wherein the voltage generator increases a voltage applied to a source terminal of the pass transistor.

20. The memory system of claim 18, wherein the voltage generator decreases a voltage applied to a gate terminal of the pass transistor.

* * * * *